US00RE45111E

(19) United States
(12) Reissued Patent
Bean, Jr.

(10) Patent Number: US RE45,111 E
(45) Date of Reissued Patent: Sep. 9, 2014

(54) IT EQUIPMENT COOLING

(75) Inventor: John H. Bean, Jr., Wentzville, MO (US)

(73) Assignee: American Power Conversion Corporation, West Kingston, RI (US)

(21) Appl. No.: 12/316,904

(22) Filed: Dec. 10, 2008

Related U.S. Patent Documents

Reissue of:
(64) Patent No.: 7,418,825
Issued: Sep. 2, 2008
Appl. No.: 11/567,026
Filed: Dec. 5, 2006

U.S. Applications:
(62) Division of application No. 10/993,329, filed on Nov. 19, 2004, now Pat. No. 7,165,412.

(51) Int. Cl.
*F25D 3/12* (2006.01)

(52) U.S. Cl.
USPC ..... 62/259.2; 62/434; 361/699

(58) Field of Classification Search
USPC ..... 62/59, 259.2, 335, 434–435, 198–200; 165/80.4; 361/699–700
See application file for complete search history.

(56) References Cited

U.S. PATENT DOCUMENTS

| | | | |
|---|---|---|---|
| 4,350,026 | A | 9/1982 | Klein |
| 4,911,231 | A | 3/1990 | Horne et al. |
| 5,044,172 | A | 9/1991 | Inoue et al. |
| 5,206,772 | A | 4/1993 | Hirano et al. |
| 5,409,419 | A | 4/1995 | Euchner et al. |
| 5,422,767 | A | 6/1995 | Hatchett et al. |
| 5,497,288 | A | 3/1996 | Otis et al. |
| D375,725 | S | 11/1996 | Dodson |
| 5,673,029 | A | 9/1997 | Behl et al. |
| 5,724,827 | A | 3/1998 | Yamaguchi et al. |
| 5,923,496 | A | 7/1999 | Perona |
| 5,927,386 | A | 7/1999 | Lin |
| 5,969,941 | A | 10/1999 | Cho |
| 5,970,729 | A | 10/1999 | Yamamoto et al. |
| 6,034,873 | A | 3/2000 | Stahl et al. |
| 6,075,698 | A | 6/2000 | Hogan et al. |
| 6,088,660 | A | 7/2000 | Uno et al. |
| 6,158,499 | A | 12/2000 | Rhodes et al. |
| 6,168,396 | B1 | 1/2001 | Homola |
| 6,185,065 | B1 | 2/2001 | Hasegawa et al. |
| 6,185,097 | B1 | 2/2001 | Behl et al. |
| 6,297,950 | B1 | 10/2001 | Erwin |
| 6,305,180 | B1 | 10/2001 | Miller et al. |
| 6,327,143 | B1 | 12/2001 | Bonstrom et al. |

(Continued)

FOREIGN PATENT DOCUMENTS

| | | |
|---|---|---|
| DE | 10128367 A1 | 1/2003 |
| FR | 2193303 | 2/1974 |

(Continued)

*Primary Examiner* — Melvin Jones
(74) *Attorney, Agent, or Firm* — Hunter Clark PLLC

(57) ABSTRACT

A system for cooling gas heated by passing the gas over heat-producing equipment to cool the equipment comprises a heat exchanger including a first heat transfer mechanism configured to transfer heat from the heated gas to a first coolant, and a first condensing module connected for fluid communication with the heat exchanger and including second and third heat transfer mechanisms, the first condensing module being configured to transfer heat through the second and third heat transfer mechanisms from the first coolant to second and third coolants in the second and third heat transfer mechanisms, respectively.

37 Claims, 15 Drawing Sheets

(56) References Cited

U.S. PATENT DOCUMENTS

| | | | |
|---|---|---|---|
| 6,375,561 | B1 | 4/2002 | Nicolai et al. |
| 6,396,689 | B1 | 5/2002 | Yu et al. |
| 6,414,845 | B2 | 7/2002 | Bonet |
| 6,459,579 | B1 | 10/2002 | Farmer et al. |
| 6,463,997 | B1 | 10/2002 | Nicolai et al. |
| 6,494,054 | B1 | 12/2002 | Wong et al. |
| 6,535,382 | B2 | 3/2003 | Bishop et al. |
| 6,574,104 | B2 | 6/2003 | Patel et al. |
| 6,583,991 | B1 | 6/2003 | Furuta et al. |
| 6,704,196 | B1 | 3/2004 | Rodriguez et al. |
| 6,746,502 | B2 | 6/2004 | Yair et al. |
| 6,788,535 | B2 | 9/2004 | Dodgen et al. |
| 6,836,407 | B2 | 12/2004 | Faneuf et al. |
| 6,862,179 | B2 | 3/2005 | Beitelmal et al. |
| 6,997,006 | B2 | 2/2006 | Kameyama et al. |
| 7,003,971 | B2 | 2/2006 | Kester et al. |
| 7,032,398 | B2 | 4/2006 | Dilk et al. |
| 7,065,979 | B2 | 6/2006 | Arshansky et al. |
| 2005/0225936 | A1 | 10/2005 | Day |

FOREIGN PATENT DOCUMENTS

| | | |
|---|---|---|
| FR | 2831019 | 4/2003 |
| JP | 5332568 | 12/1993 |
| JP | 10-322059 | 12/1998 |
| JP | 2003-166729 | 6/2003 |

IT EQUIPMENT COOLING

Matter enclosed in heavy brackets [ ] appears in the original patent but forms no part of this reissue specification; matter printed in italics indicates the additions made by reissue.

RELATED APPLICATIONS

This *reissue application claims priority to U.S. Pat. No. 7,418,825 which was a* divisional application [claims] *of and claimed* priority to U.S. application Ser. No. 10/993,329, filed Nov. 19, 2004, now U.S. Pat. No. 7,165,412, *each of* which is incorporated by reference in its entirety.

BACKGROUND

Communications and information technology equipment is commonly designed for mounting to racks and for housing within enclosures (often included in the term "rack"). Equipment racks are used to contain and to arrange communications and information technology equipment, such as servers, CPUs, internetworking equipment and storage devices, in small wiring closets as well as equipment rooms and large data centers. An equipment rack can be an open configuration and can be housed within a rack enclosure, although the enclosure may be included when referring to a rack. A standard rack typically includes front-mounting rails to which multiple units of equipment, such as servers and CPUs, are mounted and stacked vertically within the rack. The equipment capacity of a standard rack relates to the height of the mounting rails. The height is set at a standard increment of 1.75 inches, which is expressed as "U" units or the "U" height capacity of a rack. A typical U height or value of a rack is 42 U, and an exemplary industry standard rack is about six to six-and-a-half feet high, by about 24 inches wide, by about 40 inches deep. A standard rack at any given time can be sparsely or densely populated with a variety of different components as well as with components from different manufacturers.

Most rack-mounted communications and information technology equipment consumes electrical power and generates heat. Heat produced by rack-mounted equipment can have adverse effects on the performance, reliability and useful life of the equipment components. In particular, rack-mounted equipment housed within an enclosure is particularly vulnerable to heat build-up and hot spots produced within the confines of the enclosure during operation. The amount of heat generated by a rack of equipment is dependent on the amount of electrical power drawn by equipment in the rack during operation. Heat output of a rack can vary from a few watts per U of rack capacity up to about 950 watts per U (with this upper end continuing to rise), depending on the number and the type of components mounted to the rack. Also, users of communications and information technology equipment add, remove, and rearrange rack-mounted components as their needs change and new needs develop. The amount of heat a given rack or enclosure can generate, therefore, can vary considerably from a few tens of watts up to about 40,000 watts, and this upper end continues to increase.

Rack-mounted equipment typically cools itself by drawing air along a front side or air inlet side of a rack, drawing air through its components, and subsequently exhausting air from a rear or vent side of the rack. Airflow requirements to provide sufficient air for cooling can vary considerably as a result of different numbers and types of rack-mounted components and different configurations of racks and enclosures.

Equipment rooms and data centers are typically equipped with an air conditioning or cooling system that supplies and circulates cool air to racks. Many air conditioning or cooling systems, such as the system disclosed in U.S. Pat. No. 6,494,050, use an equipment room or data center that has a raised floor construction to facilitate air conditioning and circulation functions. These systems typically use open floor tiles and floor grills or vents to deliver cool air from an air passageway disposed below the raised floor of an equipment room. Open floor tiles and floor grills or vents are typically located in front of equipment racks, and along aisles between rows of racks arranged side-by-side.

The cooling systems and methods that use a raised floor construction typically do not efficiently meet the cooling requirements of rack-mounted equipment. In particular, racks that include high-power equipment having a thermal exhaust air output above 5,000 watts and up to 14,000 watts present a particular challenge for such systems and methods. A raised floor construction typically provides an open floor tile or a floor grill or vent having a venting area of about 12 by 12 inches and is configured to deliver from about 200 cfm to about 500 cfm of cool air. A rack of high-power equipment drawing up to 10,000 watts and requiring an air flow of approximately 1,800 cfm, therefore, would need about 3.5 to about 5 open floor tiles, grills or vents disposed around the rack's perimeter to supply sufficient cool air to meet its cooling requirements, with a 14 kW rack using up to about 2,240 CFM or about 4.5 to about 11.2 floor tiles. Such a floor configuration would be difficult to achieve in equipment moms crowded with racks, and impossible to implement if racks are arranged side-by-side in rows. Air cooling systems and methods that incorporate raised floor configurations, thus, are typically only used with racks spaced apart to provide sufficient floor area to accommodate multiple open floor tiles, grills or vents. For typical rack spacing, this places a limit on the density of equipment that can be achieved. When a raised floor is not used, distributing cool air from one or more centralized air conditioning systems is even more difficult, as the cool air typically is distributed across a room containing rows of racks.

Equipment rooms and data centers are often reconfigured to meet new and/or different equipment needs that require individual racks to be relocated and/or replaced. In this context, raised floor air cooling systems and methods are inflexible and can typically only be reconfigured and/or retrofitted to service rearranged, relocated and/or newly installed equipment racks at considerable cost. Raised floor configurations cannot easily and inexpensively accommodate the manner by which users typically deploy equipment racks and reconfigure equipment rooms and data centers to meet their new or changing needs.

In addition, cooling systems and methods that use raised floor construction lack physical flexibility and portability to operatively account for a wide variation in electrical power consumption between different racks in an equipment room, and, in particular, between racks and enclosures located in the same row. Cooling systems and methods that rely upon raised floor air passageways and open floor tiles, grills or vents to supply cool air may not be able to easily and inexpensively vary or concentrate cool air to those high power racks that consume relatively large amounts of electrical power and have a high thermal air exhaust output. In addition, newly installed equipment may draw more electrical power than replaced or existing equipment that may lead to thermal problem areas in functioning equipment rooms.

Further, with existing air conditioning solutions, hot spots can develop in a room due to a lack of proper recirculation of exhaust air from racks to the return side of a room air conditioner. This can cause racks to undesirably draw warm air into the racks. To attempt to overcome air circulation problems, many room air conditioners are designed to provide very cool air of approximately 58° F. and receive return air having a typical temperature of approximately 78° F. With an output air temperature of 58° F., it is often necessary to add a humidification system to increase moisture in the air in a data center due to the high level of dehumidification created as a byproduct of over cooling the air. Such humidification systems can be expensive to install and operate.

SUMMARY

In general, in an aspect, the invention provides a system for cooling gas heated by passing the gas over heat-producing equipment to cool the equipment, the system comprising a heat exchanger including a first heat transfer mechanism configured to transfer heat from the heated gas to a first coolant, a first condensing module connected for fluid communication with the heat exchanger and including second and third heat transfer mechanisms, the first condensing module being configured to transfer heat through the second and third heat transfer mechanisms from the first coolant to second and third coolants in the second and third heat transfer mechanisms, respectively, the first condensing module comprising: a first cooling subsystem including the first heat transfer mechanism and being configured to receive heated vapor phase first coolant and to transfer heat from the first coolant to the second coolant in the first heat transfer mechanism to cool and condense the heated first coolant; and a second cooling subsystem including the second heat transfer mechanism and being configured to receive heated vapor phase first coolant and to transfer heat from the first coolant to the third coolant in the second heat transfer mechanism to cool and condense the heated first coolant, the system further comprising at least one processor electrically coupled to the first condensing module and configured to control which of the first and second cooling subsystems cools and condenses the first coolant, and a distribution arrangement connected for fluid communication with the first condensing module and the heat exchanger and configured to transfer the first coolant from the first condensing module to the heat exchanger.

Implementations of the invention may include one or more of the following features. The at least one processor is configured to actuate the second cooling subsystem for cooling the heated first coolant if the first cooling subsystem is inoperable, and the system further comprises an uninterruptible power supply, including a battery, coupled to the second cooling subsystem to provide battery power to the second cooling subsystem. The system further comprises a backup condensing module that is connected for fluid communication with the second cooling subsystem and that comprises an ice storage tank. The backup condensing module is configured to receive third coolant from the second cooling subsystem and to transfer heat between the third coolant and water in the ice storage tank to cool the third coolant if the water is cooler than the received third coolant, and to cool the water if the received third coolant is cooler than the water. The at least one processor is configured to control operation of the first and second cooling subsystems such that: if the first cooling subsystem is operational and it is currently desired to form ice in the backup cooling subsystem, then the second cooling subsystem is actuated to subcool the third coolant below 32° F. and to provide the subcooled third coolant to the backup condensing module; and if the first cooling subsystem is non-operational and the second cooling subsystem is operational, then the second cooling subsystem is actuated to cool the third coolant using the ice in the backup cooling subsystem and to cool the first coolant using the third coolant that is cooled by the ice. The at least one processor is configured to cause the second cooling subsystem to be actuated to subcool the third coolant only if the first cooling subsystem, in combination with other condensing modules if any, is able to supply cooling of the first coolant in excess of a demand for cooling of the first coolant. The at least one processor is configured to cause the second cooling subsystem to be actuated to subcool the third coolant only if the first cooling subsystem, in combination with other condensing modules if any, is able to cool the first coolant in excess of a maximum anticipated demand for cooling of the first coolant. The system comprises at least one condensing module in addition to the first condensing module, and wherein the at least one processor is configured to cause the second cooling subsystem of the first condensing module to be actuated to subcool the third coolant only if the at least one condensing in addition to the first condensing module is able to supply cooling of the first coolant in excess of a maximum anticipated demand for cooling of the first coolant. The backup cooling subsystem comprises multiple ice storage tanks and wherein the at least one processor is configured to determine that it is undesirable to form ice in the backup cooling subsystem if all of the ice storage tanks are considered full of ice.

Implementations of the invention may also include one or more of the following features. The at least one processor is configured to control the first and second cooling subsystems and the distribution arrangement such that the first coolant is provided to the heat exchangers at a desired temperature and pressure. The at least one processor is configured to control the first and second cooling subsystem and the distribution arrangement such that the third coolant is provided to the heat exchangers at a desired, constant temperature with different amounts of the third coolant in the system.

In general, in another aspect, the invention provides a system for cooling gas heated by passing the gas over heat-producing equipment to cool the equipment, the system comprising a heat exchanger section comprising a heat exchanger configured to receive a first coolant and to transfer heat from the heated gas to the first coolant, a cooling subsystem configured to receive heated first coolant from the heat exchanger and to cool the heated first coolant, a distribution arrangement connected to the heat exchanger and the cooling subsystem and configured to transfer the cooled first coolant from the cooling subsystem to the heat exchanger and to transfer the heated first coolant from the heat exchanger to the cooling subsystem, and at least one processor coupled to the cooling subsystem, the heat exchanger section, and the distribution arrangement and configured to: determine a dew point of the gas associated with the heat exchanger; monitor a physical characteristic of the first coolant relevant to saturation of the first coolant; and control supply of the first coolant to the heat exchanger such that a combination of temperature and pressure of the first coolant entering the heat exchanger put the first coolant at a saturation point of the first coolant with a first coolant temperatures being above the determined dew point temperature.

Implementations of the invention may include one or more of the following features. The cooling subsystem further comprises a first coolant temperature sensor and a first coolant pressure sensor configured to monitor temperature and pressure of the first coolant exiting the cooling subsystem, the at least one processor being coupled to the first coolant temperature sensor and the first coolant pressure sensor and configured to regulate the cooling subsystem such that the temperature and pressure of the first coolant exiting the cooling subsystem are at desired levels. The heat exchanger section includes multiple heat exchangers and the at least one processor is configured to: determine respective dew points of the gas in respective vicinities of each of the heat exchangers; monitor the physical characteristic of the first coolant near an entrance to each of the heat exchangers; and control supply of the first coolant to the heat exchangers such that combinations of temperature and pressure of the first coolant entering respective ones of the heat exchangers put the first coolant at saturation points of the first coolant with respective first coolant temperatures being above respective determined dew point temperatures. The system further comprises a heat exchanger temperature (HET) sensor and a heat exchanger humidity (HEH) sensor configured to monitor a temperature and a humidity of the heated gas disposed adjacent to the heat exchanger, the at least one processor being coupled to the HET sensor and to the HEH sensor and being configured to use temperature and humidity indicia from the HET and HEH sensors to determine the at least one dew point.

In general, in another aspect, the invention provides an ice storage system comprising an equipment rack housing of industry-standard dimensions for housing rack-mountable information technology equipment, an ice storage tank comprising: a tank housing configured to provide a reservoir for holding water; a heat exchanger disposed in the tank housing and configured to convey coolant and to transfer heat between the water and the coolant; and a level indicator configured to monitor and provide a first indication of a level of water in the reservoir, the system further comprising an input line, disposed through the equipment rack housing, configured to receive the coolant and being coupled to an input of the heat exchanger, and an output line, disposed through the equipment rack housing, configured to convey the coolant from the equipment rack and being coupled to an output of the heat exchanger, where the ice storage tank is disposed inside the equipment rack housing.

Implementations of the invention may include one or more of the following features. The system comprises multiple ice storage tanks and each ice storage tank includes at least one shutoff valve configured to selectively inhibit the coolant from flowing through the heat exchanger in response to a second indication that an amount of ice in the corresponding reservoir is above a threshold amount. The system comprises multiple ice storage tanks and three ice storage tanks are disposed in the equipment rack housing.

In general, in another aspect, the invention provides a system for cooling gas heated by passing the gas over heat-producing equipment to cool the equipment, the system comprising a heat exchanger configured to receive a first coolant and to transfer heat from the heated gas to the first coolant, a cooling apparatus that includes a heat transfer mechanism and that provides a chamber, the heat transfer mechanism being configured to transfer heat from the first coolant disposed in the chamber to a second coolant disposed in the heat transfer mechanism, a first shutoff valve connected to an output of the cooling apparatus for receiving the first coolant and connected to an input of the heat exchanger to selectively permit flow of the first coolant from the cooling apparatus to the heat exchanger, a second shutoff valve connected to an output of the heat exchanger and connected to an input of the cooling apparatus to selectively permit flow of the first coolant from the heat exchanger toward the cooling apparatus, a third shutoff valve coupled to the heat exchanger, and a pump arrangement connected to the third shutoff valve and configured to draw gas and the first coolant through the third shutoff valve from the heat exchanger.

Implementations of the invention may include one or more of the following features. The pump arrangement is configured to vent the drawn gas to a region external to the system. The pump arrangement is further connected to the cooling apparatus and is configured to convey the drawn first coolant to the cooling apparatus. The system comprises first, second, and third shutoff valves connected to the output of the cooling apparatus, the input of the cooling apparatus, and the pump arrangement, respectively, the system further comprising a processor coupled to the first, second, and third shutoff valves and to the pump arrangement, the processor being configured to control the shutoff valves and the pump arrangement such that: in response to an indication to add a new heat exchanger to the system with the new heat exchanger being coupled to a set of the first, second, and third shutoff valves, the processor will cause the first and second shutoff valves of the set to be closed, the third shutoff valve of the set to be opened, the pump arrangement to draw gas from the new heat exchanger until a desired pressure is attained in the new heat exchanger and then the processor will cause the third shutoff valve of the set to be closed, and the first and second shutoff valves of the set to be opened; and in response to an indication to remove a certain heat exchanger from the system with the certain heat exchanger being coupled to the set of the first, second, and third shutoff valves, the processor will cause the first and second shutoff valves of the set to be closed, the third shutoff valve of the set to be opened, the pump arrangement to draw the first coolant from the certain heat exchanger until a desired pressure is attained in the certain heat exchanger and then the processor will cause the third shutoff valve of the set to be closed, and the first and second shutoff valves of the set to be opened.

In general, in another aspect, the invention provides a system for cooling gas heated by passing the gas over heat-producing equipment to cool the equipment, the system comprising a condenser including a plurality of heat transfer elements, a heat exchanger configured to receive a first coolant from the condenser, to transfer heat from the heated gas to the first coolant, and to supply the heated first coolant to the condenser, a pump arrangement coupled to the condenser and the heat exchanger and configured to pump the first coolant from the condenser to the heat exchangers, and cooling means for transferring heat from the first coolant through at least one of a plurality of heat transfer elements into at least one of a second coolant and a third coolant.

Implementations of the invention may include one or more of the following features. The cooling means is configured to select between which one of the second coolant and the third coolant to use to cool the first coolant. The cooling means includes primary cooling means for cooling the second coolant, and backup means for cooling the third coolant. The system backup means comprises an ice storage tank, the primary means is configured to cool the third coolant, and the cooling means is configured to direct the third coolant cooled by the primary means to the backup means to freeze water stored in the ice storage tank. The cooling means is configured to regulate amounts of the second coolant provided to the condenser to control at least a temperature of the first coolant pumped from the condenser. The system further comprises pump regulator means for regulating the pump arrangement to control pressure of the first coolant such that the first coolant entering the heat exchanger will be at saturation while a temperature of the first coolant entering the heat exchanger is above a dew point temperature of the heated gas in a vicinity of the heat exchanger.

In general, in another aspect, the invention provides a method of cooling information technology equipment using a heat exchanger, the method comprising sensing a humidity of gas in a vicinity of the heat exchanger, sensing a gas temperature of the gas in the vicinity of the heat exchanger, determining, from the humidity and the gas temperature, a dew point temperature of the gas in the vicinity of the heat exchanger, determining a saturation point combination of saturation coolant temperature and saturation coolant pressure for a coolant to be supplied to the heat exchanger such that the saturation coolant temperature is above the dew point temperature and the coolant is saturated, and supplying the coolant to the heat exchanger such that the coolant has the determined combination of saturation coolant temperature and saturation coolant pressure entering the heat exchanger.

Implementations of the invention may include one or more of the following features. Supplying the coolant includes adjusting cooling of the coolant such that the temperature of the coolant entering the heat exchanger is at about the saturation coolant temperature.

In general, in another aspect, the invention provides a system for cooling gas heated by heat-producing electronic equipment, the system comprising a heat exchanger configured to transfer heat from the heated gas to a first coolant, a first cooling module connected for fluid communication with the heat exchanger and including a first condenser configured to cool and condense incoming first coolant from vapor to liquid, the first cooling module being configured to transfer heat from the first coolant to a second coolant to cool the first coolant. a second cooling module connected for fluid communication with the heat exchangers and including a second condenser configured to cool and condense incoming first coolant from vapor to liquid, the first cooling module being configured to transfer heat from the first coolant to a third coolant to cool the first coolant, and a condenser-charge controller-configured to regulate a first coolant liquid level in the first condenser.

Implementations of the invention may include one or more of the following features. The condenser-charge controller comprises first and second condenser-charge controller subsystems connected and configured to control liquid levels in the first and second condensers, respectively. The first and second subsystems each include a liquid level sensor configured to determine a liquid level in the respective condenser, a pump, and a controller coupled to the pump and the liquid level sensor and configured to regulate the pump to affect the corresponding liquid level. The liquid level sensor is a pressure differential sensor and the cooling module includes a coolant container connected to the condenser and the pump and the liquid level sensor is connected to the coolant container to determine the liquid level in the coolant container, the liquid level in the coolant container being related to the liquid level of the condenser. The first and second cooling modules further comprise a container connected to the condenser and configured to store the first coolant, a pump connected to the container and configured to pump the first coolant from the container, a purge mechanism connected to the pump, a purge controller coupled to the purge mechanism and configured to actuate the purge mechanism to purge at least some of the first coolant pumped by the pump, a fill mechanism connected to the container, and a fill controller coupled to the fill mechanism and configured to actuate the fill mechanism to supply liquid first coolant to the container. The purge controller is configured to actuate the purge mechanism if the pump is operating at about full capacity and the liquid level of the container rises above an upper threshold level and/or more than a first threshold amount. The fill controller is configured to actuate the fill mechanism if the pump is operating at about minimum capacity and the liquid level of the container drops below a lower threshold level and/or more than a second threshold amount.

In general, in another aspect, the invention provides a data center cooling system comprising equipment racks configured to house data center equipment, the racks being arranged in rows such that equipment disposed in the racks will vent hot air into an aisle defined between the rows of racks, and a heat exchanger unit including s heat exchanger configured to draw in and cool air from the aisle, the heat exchanger unit including: a housing configured to contain the heat exchanger, and a mounting apparatus connected to the housing and to at least one rack, the mounting apparatus configured such that the heat exchanger is disposed at least partially vertically aligned with the aisle.

Implementations of the invention may include one or more of the following features. The mounting apparatus is configured such that the heat exchanger is disposed at least partially directly over the aisle. The mounting apparatus is configured such that the heat exchanger is disposed substantially entirely directly over the aisle. The mounting apparatus is configured to connect to at least one rack in each of two different rows of the equipment racks such that the heat exchanger unit straddles the aisle.

In general, in another aspect, the invention provides a system for cooling gas heated by passing the gas over heat-producing equipment to cool the equipment, the system comprising a heat exchanger including a heat exchanger heat transfer mechanism configured to transfer heat from the heated gas to a heat exchanger coolant, a first condensing module connected for fluid communication with the heat exchanger and including a first heat transfer mechanism, the first condensing module being configured to transfer heat through the first heat transfer mechanism from the heat exchanger coolant to a first coolant in the first heat transfer mechanism, and a second condensing module connected for fluid communication with the heat exchanger and including a second heat transfer mechanism, the second condensing module being configured to transfer heat through the second heat transfer mechanism from the heat exchanger coolant to a second coolant in the second heat transfer mechanism.

Implementations of the invention may include one or more of the following features. The first and second condensing modules are coupled in parallel through a single coolant loop to the heat exchanger. The system further comprises a processor coupled to the first and second condensing modules and configured to assign a cooling task to each of the condensing modules based upon expected cooling demand for the heat exchanger coolant and cooling capacities providable by at least the first and second condensing modules. The processor is configured to assign the first condensing module as a primary module for cooling the heat exchanger coolant, to assign the second condensing module as a lag module, for cooling the heat exchanger coolant, if the expected cooling demand exceeds a cooling capacity providable by the first condensing module, and to assign the second condensing module as a redundant module if the cooling capacity of the first condensing module plus the cooling capacity of any lag condensing modules is at least as great as the expected cooling demand, the redundant module being designated for use in cooling a backup refrigerant if the primary module and any lag modules are operational and for cooling the heat exchanger coolant if the primary module or any lag modules are not operational. The primary condensing module is used to cool the heat exchanger coolant unless the primary condensing module is inoperative, the lag module, if any, is used to cool the heat exchanger coolant if the cooling demand exceeds the cooling capacity of the primary module and any other lag module, and the redundant module, if any, is used to cool the heat exchanger coolant if any of the primary and lag, if any, modules is inoperative and the cooling demand exceeds the cooling capacity of the operative primary and lag, if any, modules, and is used to produce ice if the cooling capacity of the operative primary and lag, if any, modules at least meets the cooling demand.

Implementations of the invention may also include one or more of the following features. The system is configured to use excess cooling capacity of the second condensing module to produce ice for use in cooling the heat exchanger coolant if the first condensing module is inoperative. The second heat transfer mechanism is further configured to transfer heat through the second heat transfer mechanism from the heat exchanger coolant to a third coolant in the second heat transfer mechanism. The system further comprises an ice storage tank connected to the second heat transfer mechanism, where the second condensing module includes a battery and a pump connected to the battery and the ice storage tank, and where the battery can be used to power the pump to circulate the third coolant between the second heat transfer mechanism and the ice storage tank to cool the third coolant with the ice and to cool the heat exchanger coolant with the third coolant. The first and second condensing modules each have a cooling capacity that is no greater than an expected cooling demand for the heat exchanger coolant. The first and second condensing modules each have a cooling capacity that is at least as great as an expected cooling demand for the heat exchanger coolant.

Various aspects of the invention may provide one or more of the following advantages. A highly-available, fault-tolerant IT cooling system may be provided. Heat exchanger modules can be easily added and/or removed from a cooling system. Varying cooling needs can be accommodated. A multi-vector cooling system may be provided. Three, and possibly more, subsystems can be provided and selectively used to cool coolant for cooling hot equipment exhaust gases. Equipment can be cooled during power failures using battery power and thermal ice storage. Applications of high-densities of heat-producing equipment can be supported. Hot equipment exhaust gas can be cooled efficiently. Hot equipment exhaust gas can be cooled without substantially mixing the hot exhaust gas with cooler ambient gas. Heat-producing equipment can be cooled without introducing moisture to cooled exhaust gas. Load changes of heat-producing equipment, e.g., in heat produced by a particular piece of equipment, a change in number of pieces of equipment, and/or a change in location of equipment, can be accommodated. High-density cooling can be provided, e.g., for high-density equipment installations. Cooling capacity demand increases (e.g., incremental increases) can be accommodated. Cooling capacity can be modulated to better match thermal requirements. N+1 redundancy can be provided.

These and other advantages of the invention, along with the invention itself, will be more fully understood after a review of the following figures, detailed description, and claims.

DETAILED DESCRIPTION OF PREFERRED EMBODIMENTS

Embodiments of the invention provide techniques for cooling IT (Information Technology) equipment in the data center environment. Exemplary embodiments of the invention include one or more main condensing modules, a coolant distribution section, a heat exchanger module section, and a backup coolant section. The coolant distribution section includes a bulk storage tank, an evacuation/recovery pump, a manifold and hoses. The condensing modules section sends cool liquid to the heat exchanger module section by means of the distribution section, where the liquid is evaporated, vapor phase, into gas by hot air from the IT equipment, and the vapor coolant is returned to the main condensing module(s). At the main condensing module(s), a primary cooling portion cools the heated vapor coolant back into a liquid for supply to the heat exchanger module section by the distribution section. In the case of a failure to one of the primary condensing modules, a secondary condensing module can cool and condense the heated vapor coolant if power has not failed to the system. If power has failed to the system, the backup coolant section that includes several ice storage tanks can continue to cool, without using high power consumption vapor compression systems, the heated coolant from the heat exchange module section for the duration of battery life or depletion of ice storage of the system. Other embodiments are within the scope of the invention.

Figure 1:
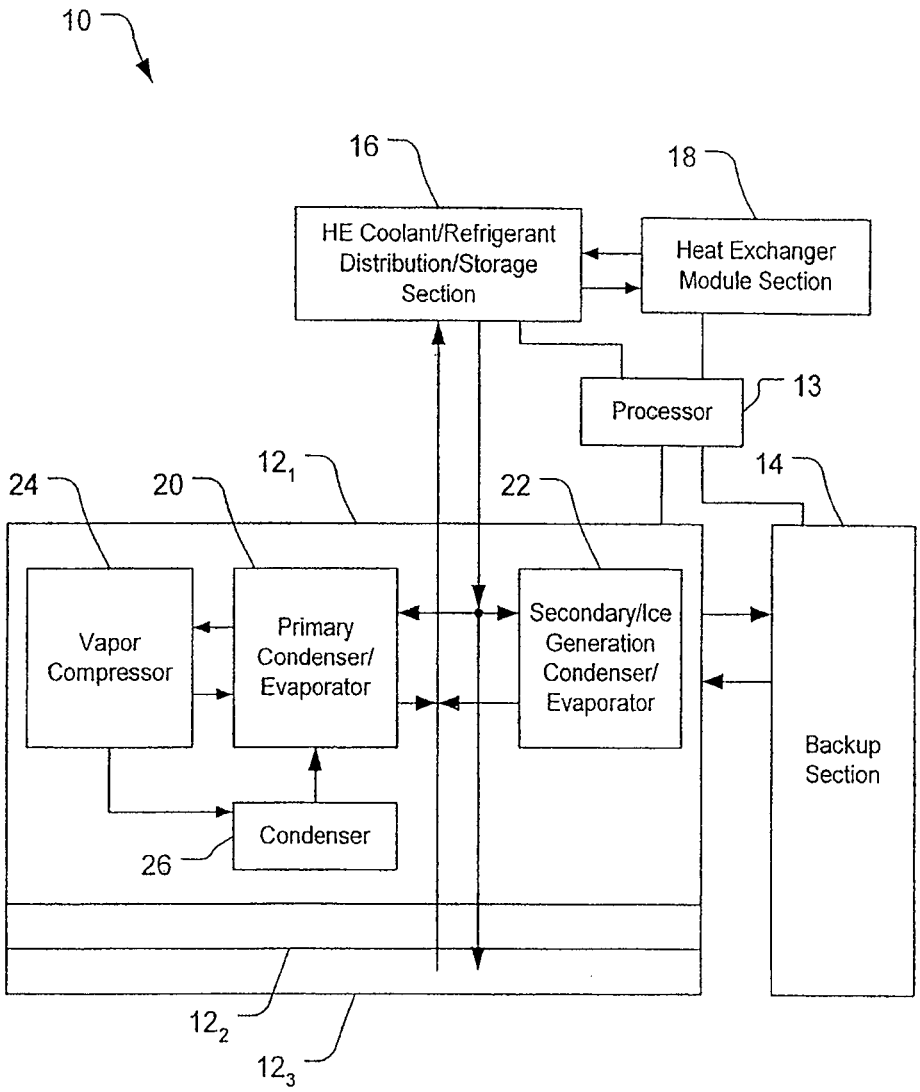
FIG. 1 is a simplified block diagram of a cooling system according to the invention.

Referring to FIG. 1, an IT cooling system 10 includes main condensing modules 12, a processor 13, a backup section 14, a coolant distribution and storage section 16, and a heat exchanger (HE) module section 18. While three condensing modules 12 are shown in FIG. 1, other quantities of the modules 12 (e.g., one or two) may be used. The system 10 is configured to cool hot IT exhaust air in the HE module section 18 by supplying HE coolant from the coolant distributor 16 that is cooled and condensed by the condensing modules 12. The modules 12 cool and condense the vapor coolant using a primary condenser/evaporator (C/E) 20 in conjunction with a vapor compressor 24 and a condenser 26. The system 10, however, may cool and condense the HE coolant using the backup section 14. The backup section 14 here is an ice storage and glycol distribution section, but it is possible that the backup section 14 could be a chilled water system acting as either the primary or backup system. The modules 12 may be connected to the backup section 14 through a single pair of input output lines or multiple lines (e.g., a pair corresponding to each module 12). The secondary condenser 22 may be used in cases where there is a failure to the primary condenser 20 but not a power failure, while the backup section 14 may be used if there is a power failure affecting the primary condenser 20. The secondary condenser 22 is configured to operate as an evaporator interacting with the primary condenser 20 in a standby-mode to form ice in the ice storage section 14 for future use in cases of one or more failures (e.g., power loss) affecting the primary condenser 20.

The processor 13 is connected to the modules 12 and the sections 14, 16, 18 for monitoring and controlling operation of the system 10. Functions described below relating devices (e.g., PID controllers) and/or to control of devices noted may be performed by measuring appropriate characteristics of the system, monitoring measurements by the processor 13, having the processor 13 manipulate the measurements, and having the processor 13 provide appropriate control signals to appropriate devices. The processors 13 may be physically disposed within one of the modules 12 or the sections 14, 16, 18. Further, more than one processor may be used, and the processors disposed at different locations, e.g., in multiple ones, and possibly all, of the modules 12 and/or sections 14, 16, 18. The discussion below refers only to the processor 13, but other embodiments are included in the discussion by reference to the processor 13.

Figure 2:
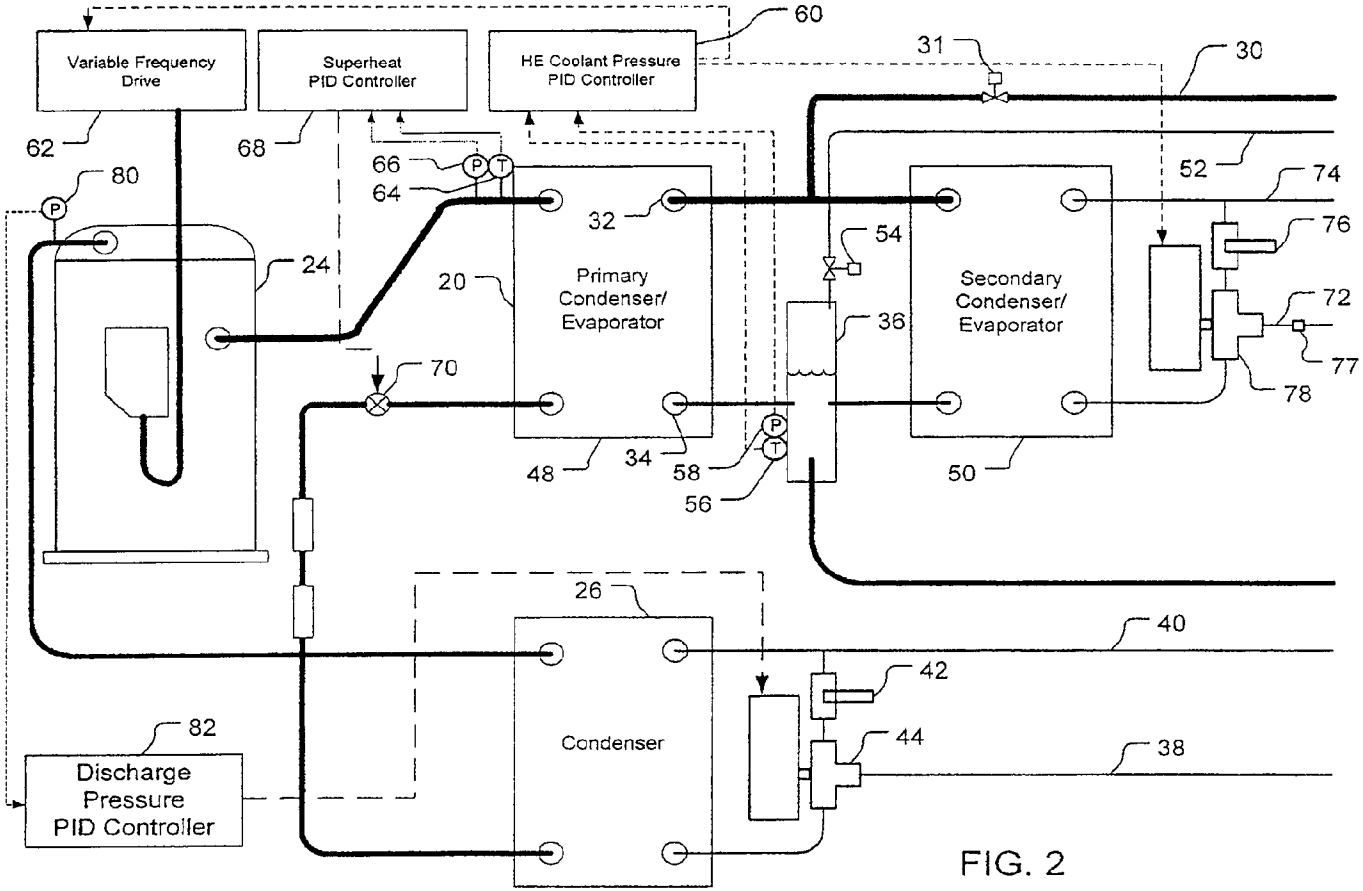
FIG. 2 is a simplified diagram of a cooling module of the system shown in FIG. 1.

Referring to FIG. 2, the main condensing module 12 includes the primary C/E 20, the secondary/ice generation C/E 22, the vapor compressor 24, and the condenser 26. The cooling module 12 is configured to cool coolant that is heated in the HE module section 18 (FIG. 1), condense this coolant and provide the cooled, condensed coolant for return to the HE module section 18 for use in cooling further hot air, e.g., produced by IT equipment. The coolant received from the HE module section 18 and cooled by the module 12 is referred to as HE coolant, and may be any of various coolants, preferably R134A. Coolant used between the primary C/E 20, the compressor 24, and the condenser 26 is referred to as primary coolant and may be any of a variety of coolants, preferably R410A. Also, fluid used between the secondary C/E 22 and the backup section 14 is referred to as secondary coolant and may be any of a variety of coolants, preferably a glycol-water solution. The module 12 is further configured to chill the glycol solution, e.g., during times when the particular module 12 is not used to condense heated IT air, and provide this chilled solution to the backup section 14, that includes ice storage tanks to produce/store ice for backup cooling of the HE coolant. The module 12 is further configured to melt the ice, e.g., during failures of the primary C/E 20, in the backup section 14 to cool and condense the HE coolant for cooling the heated IT air. The module 12 provides redundancy through the redundant C/Es 20, 22 as desired (e.g., if the C/E 20 is unavailable, the C/E 22 can still provide condensing).

The primary C/E 20, the vapor compressor 24, and the condenser 26 are connected and configured to cool/condense the vapor HE coolant received in a line 30 as regulated by an isolation valve 31. The primary C/E 20 is configured to absorb heat from the hot vapor HE coolant through a heat exchanger into the primary coolant ("hot" being used as a relative term as the vapor HE coolant is typically <70° F.). The vapor HE coolant enters the primary C/E 20 through an input 32, is cooled by the primary C/E 20, and cool, liquid HE coolant exits through an output 34 into an HE coolant container 36. Heat is transferred from the HE coolant to the primary coolant, thereby cooling the HE coolant and heating the primary coolant. The heated primary coolant passes from the primary C/E 20 to the compressor 24. The compressor 24 is configured to mechanically increase the pressure of the primary coolant such that the primary coolant entering the condenser 26 is at a saturation temperature above the temperature of fluid entering the condenser from the supply line 38. The compressor 24 is connected to the condenser 26 to pass the high-pressure (e.g., about 440 psi) high-temperature (e.g., about 190° F.) primary coolant to the condenser 26. The condenser 26 is configured to cool and condense the primary coolant through heat exchange (via heat exchanger plates) with condenser water supplied via a line 38 and expelled through a line 40, with the lines 38, 40 connected by an isolation valve 42. The amount of water supplied through the line 40 is regulated, to maintain design pressures, by a regulator valve 44 connected to the intake line 38. The condenser 26 cools the primary coolant sufficiently below saturation to induce a phase change to leave the primary coolant as a subcooled liquid. The condenser 26 is connected to the primary C/E 20 and configured to supply relatively high-pressure (e.g., about 440 psi), relatively moderate-temperature (e.g., about 105° F.) sub-cooled liquid primary coolant to the primary C/E 20.

Figure 3:
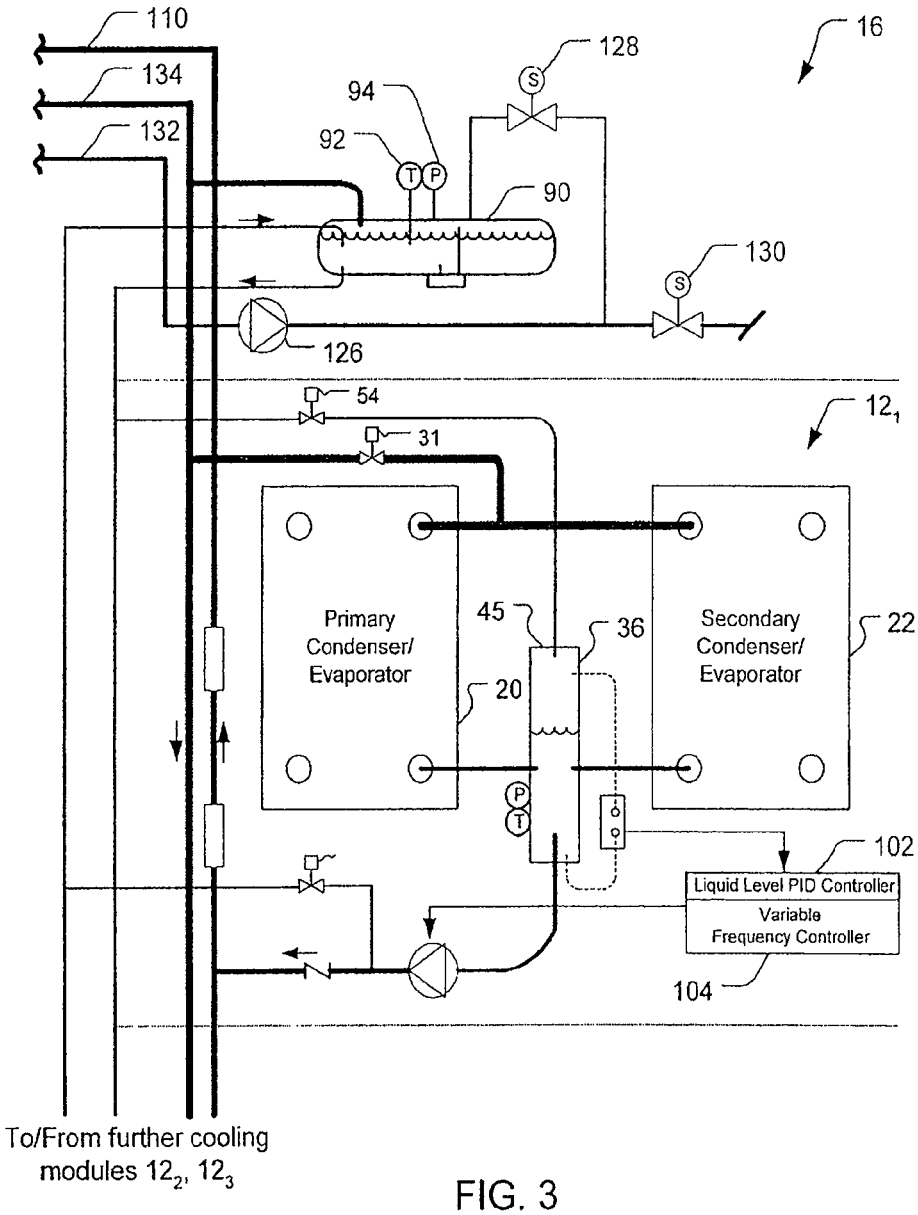
FIG. 3 is a simplified diagram of a coolant distribution section and a portion of a cooling module of the system shown in FIG. 1.

The HE coolant container 36 is configured and disposed to retain HE coolant at an equilibrium level between the primary and secondary C/Es 20, 22. The container 36 is configured to hold liquid HE coolant flowing from the C/Es 20, 22. The container 36 is physically disposed with a bottom 46 at a known elevation from the bottoms 48, 50 of the C/Es 20, 22 and sized such that the container extends higher than a level of the HE coolant. The level of the HE coolant equalizes to the same level in the C/Es 20, 22 and the container 36. This level is monitored by liquid level sensor 100 (FIG. 3). Additional HE coolant may be added to the container 36 through a fill line 52 as controlled by a solenoid valve 54. Furthermore excessive HE coolant may be purged back to bulk storage tanks by opening a solenoid valve 106 (FIG. 3). A circulation line 111 is connected through the bottom 46 of the container 36 through which the liquid HE coolant can be circulated back to the HE module section 18.

The secondary C/E 22 is connected to an intake line 72 and an output line 74 for receiving and providing the glycol solution from and to the backup ice storage section 14 (FIG. 1). The C/E 22 may also be supported by means of connection to an external chilled water system instead of ice storage, with the C/E 22 possibly functioning as the primary cooler of the vapor phase first coolant from the HEs 18. The lines 72, 74 are separated by an isolation valve 76 and glycol coming into the secondary C/E 22 is regulated by a regulation valve 78. Closure of the valve 76 will facilitate 2-way operation of the regulation valve 78.

Various sensors and controllers are provided for monitoring characteristics and regulating operation of the module 12. A temperature sensor 56 and a pressure sensor 58 are configured to monitor characteristics of the HE coolant in the container 36. Temperature and pressure values from these sensors 56, 58 are provided to an HE coolant pressure PID (proportional+integral+derivative) controller 60. The PID controller 60 uses the received values to send control signals to the regulation valve 78 and to a glycol circulation pump 77. The signals to the pump 77 cause the pump 77 to circulate glycol for ice production (described below). The PID controller 60 also sends control signals to a variable frequency drive 62 to regulate the HE coolant pressure, in conjunction with the HE coolant temperature, to help keep the HE coolant condensing pressure sufficiently below a determined pressure associated with the HE coolant temperature. For example, the pressure is controlled such that the HE coolant temperature and pressure are at a desired combination when entering the HE modules 150 (e.g., at saturation with the HE coolant temperature being above a dewpoint temperature of heated IT exhaust air). Typically, the HE coolant pressure leaving the drive 62 is about 5 psig below that of a desired heat exchanger evaporator pressure, thus facilitating a pressure differential for transporting the primary coolant from the heat exchanger section 18 back to the condensing modules 12. The variable frequency drive 62 controls the operating speed of the compressor 24 in response to the control signals from the PID controller 60. The PID controller 60 also sends control signals to a regulation valve 78. A temperature sensor 64 and a pressure sensor 66 are configured to monitor characteristics of the heat exchanger coolant exiting from the primary C/E 20 on its way to the compressor 24. The sensors 64, 66 provide indicia of the temperature and pressure of the heat exchanger coolant to a superheat PID controller 68. The PID controller 68 uses the indicia of temperature of suction gas from the sensor 64 to determine and send control signals to an electronic expansion valve 70 to regulate the superheat of the suction gas to maintain the superheat at a desired value (or within a desired range of values). Typically, the superheat is maintained between about 5° F. and about 20° F. above saturation to help prevent possible liquid ingestion by the compressor 24 and resulting damage to the compressor 24. A pressure sensor 80 is configured and connected to measure the pressure of the high-pressure, high-temperature primary coolant on its way to the condenser 26 from the compressor 24. Pressure values from the sensor 80 are used by a discharge pressure PID controller 82 to determine and send control signals to the glycol flow control valve 44. These control signals cause the valve 44 to regulate glycol or water flow to maintain the compressor discharge pressure at a desired level. A sight glass 71 and a filter dryer 73 are provided in the line connecting the condenser 26 and the C/E 20 to allow viewing, and provide cleaning and dehydration, respectively, of the primary coolant.

Referring to FIG. 3, the HE Coolant distribution/storage section 16 is physically intertwined with portions of the condensing modules 12 and includes a receiver/reservoir 90, a temperature sensor 92, a pressure sensor 94, a reclaim/vacuum pump 126, and a circulation pump 98. Each of the condensing modules 12 has a circulation pump 98, with only one of the cooling modules 12 shown in FIG. 3. The distribution section 16 is configured to pump the heat exchanger coolant from the condenser 12 (FIG. 2) to the heat exchanger module section 18 (FIG. 1). The distribution section 16 is further configured to evacuate heat exchanger modules that are newly connected to the heat exchanger module section 18, and to reclaim heat exchanger coolant from a heat exchanger module to be removed from the HE module section 18.

The circulation pump 98, the pressure differential sensor 100, a liquid level PID controller 102, variable frequency controller 104, and the liquid purge valve 106, are configured to provide the HE coolant to the HE module section 18 via a liquid output line 110 at desired pressure and temperature. The pump 98 is connected to the outlet line 110 from the container 36. The line 111 feeding the line 110 includes a swing-type check valve 114 to help ensure one-directional flow of the HE coolant in the feed line 111. The line 110 includes a sight glass 112 for viewing the HE coolant and a filter/dryer 116 that is configured to clean and dehydrate the HE coolant. The sensor 100 is configured to provide an indication of pressure differential between a top 45 and the bottom 46 of the container 36. This pressure difference is proportional to the liquid level in the container 36, which is even with the liquid levels in the C/Es 20, 22. The pressure difference indication is provided to the PID controller 102 that produces and sends control signals to the variable frequency controller 104. The controller 104 sends signals to the pump 98 to regulate the speed of the pump 98 to maintain a desired liquid level in the container 36 and the C/Es 20, 22. This level is maintained despite varying mass flow rates in the primary C/E 20, vapor compressor 24, and condenser 26 due to fluctuating heat loads managed by the heat exchanger section 18. The output HE coolant from the pump 98 feeds into the common output line 110 for conveying the HE coolant to the HE module section 18. If the liquid level remains high, or rises more than a threshold amount (e.g., rises at all), and/or above a threshold level, after the pump 98 has been operating at or near full speed (capacity), then the purge valve 106 will be opened by the processor 13 to direct some of the HE coolant to the reservoir 90 through a line 122. Alternatively, a mechanical pressure-activated valve may be used that senses excessive discharge pressure at the pump 98 and opens to divert flow into the reservoir 90, replacing the electrically-controlled solenoid valve 106.

HE coolant may be added to any of the primary coolant modules 12 as desired by operation of the liquid fill solenoid 54. With the fill solenoid 54 open, HE coolant from the reservoir 90 will be gravity-fed into a fill line 124. HE coolant in the fill line 124 is provided to the container 36 in each coolant module 12 whose fill solenoid 54 is open. The solenoid 128 is controlled by the processor 13 to supply coolant to the container 36 if the pump 98 is operating at or near minimum capacity and the liquid level in the container 36 drops more than a threshold amount (e.g., drops at all) and/or below a threshold level.

The level sensor 100, the pump 98, the purge valve 106, the solenoid 54, and the processor 13 serve as a liquid level control system. The liquid level in the container 36 is regulated by the purge valve 106 and the solenoid 54 under the control of the processor 13 depending upon the operation of the pump 98 and the status of the liquid level. This system helps to ensure that the liquid level stays within a desired range and that hence each cooling module 12 handles a fair share of the cooling load. Thus, this system helps provide a condenser-charge optimization system that helps optimize usage of the multiple cooling modules 12 and distribute cooling load somewhat evenly.

The distribution/storage section 16 further includes a reclaim solenoid 128 and a vacuum solenoid 130 in addition to the reclaim/vacuum pump 126. The reclaim/vacuum pump 126 is configured to assist with removing and adding HE modules from/to the HE module section 18. The pump 126 is connected to recovery/vacuum line 132 that is connected to the HE module section 18. The pump 126 is configured to pump liquid or vapor phase HE coolant through the line 132 from the HE module section 18 and output the liquid coolant through the reclaim solenoid 128 to the reservoir 90 (with the reclaim solenoid 128 open and the vacuum solenoid 130 closed). The pump 126 is further configured to pump gases to evacuate an interior chamber of an HE module of the module section 18. The pump 126 can pump gases through the line 132 from the HE module section 18 and exhaust the pumped gases to the atmosphere through the vacuum solenoid 130 (with the vacuum solenoid 130 open and the reclaim solenoid 128 closed).

Heated gas HE coolant to be cooled, condensed, and returned to the HE module section is received from the HE module section 18 through a vapor line 134. The heated HE coolant is provided to the C/Es 20, 22 of each of the primary condensing modules 12 whose vapor isolation solenoid 31 is open.

Referring to FIGS. 2-3, the module 12 can be set to provide chilled secondary coolant to the backup ice storage section 14 (FIG. 1) to produce ice for backup cooling of the HE coolant. For this mode of operation, the vapor isolation valve 31 is closed such that hot, vapor HE coolant is not provided to the C/Es 20, 22. In this mode, the C/Es 20, 22 work in tandem to cool the secondary coolant, e.g., a glycol solution, and provide the glycol solution to ice storage tanks. The liquid level in the container 36 is adjusted as desired for performance by opening the liquid fill solenoid 54 or opening the liquid purge solenoid 106 and running the circulation pump 98. In ice generation mode, the C/Es 20, 22 and the glycol circulation pump 77 are activated. The C/E 20 operates as a condenser and the C/E 22 operates as an evaporator. The primary HE coolant is passed between the devices 20, 22, with the device 20 cooling the HE coolant to well below the 32° F. freezing point of water, e.g., 0° F. Heat of condensation in the device 20 is transferred to the primary coolant system 20, 24, 26. The HE coolant circulated to the device 22 will undergo a phase change in the device 22, absorbing heat from the glycol solution and evaporating. The heat of evaporation absorbed from the glycol solution by means of heat transfer in the device 22 is the heat of fusion liberated from the ice storage tanks (see FIG. 5 and description below).

Figure 4:
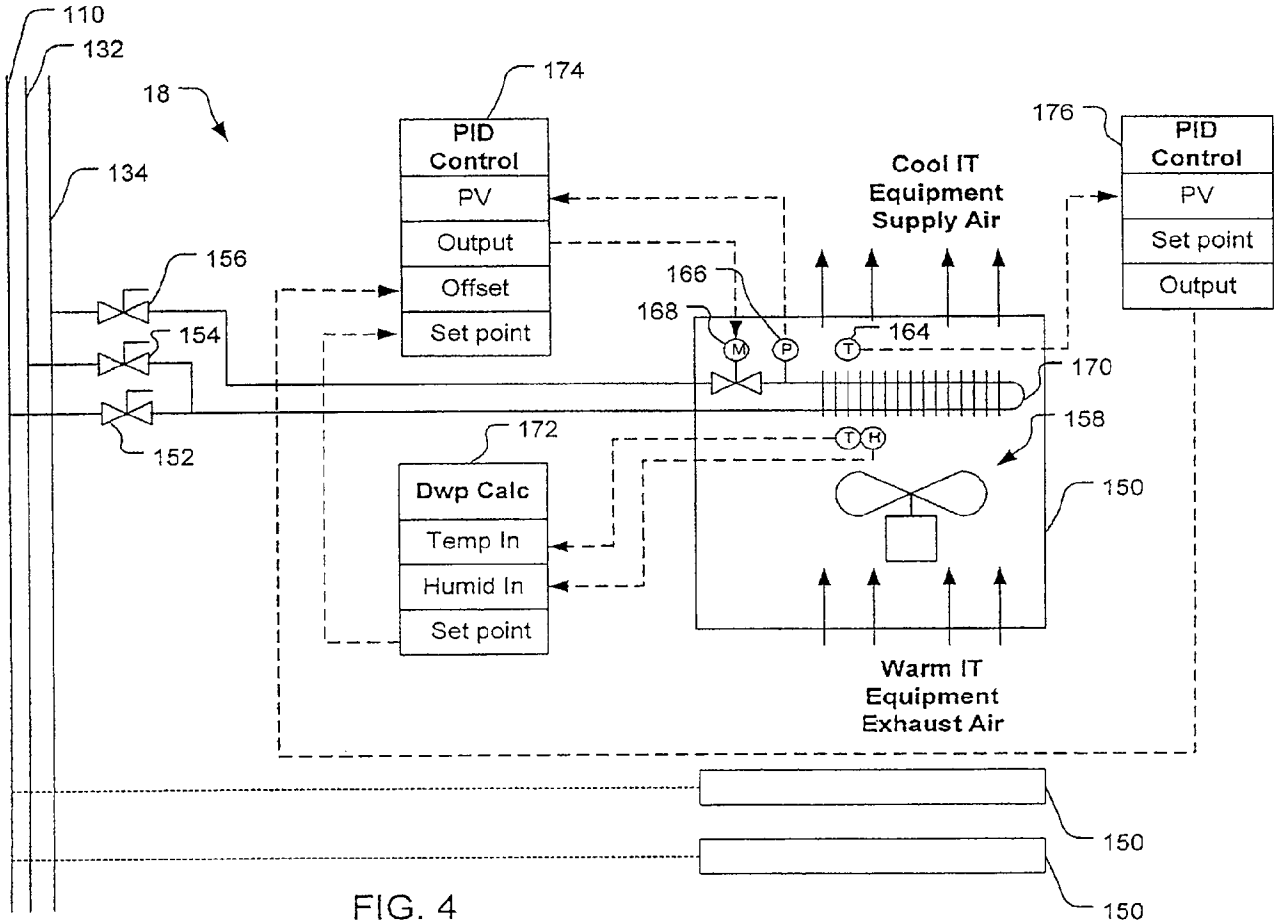
FIG. 4 is a simplified diagram of a heat exchanger module section of the system shown in FIG. 1.
Figure 11:
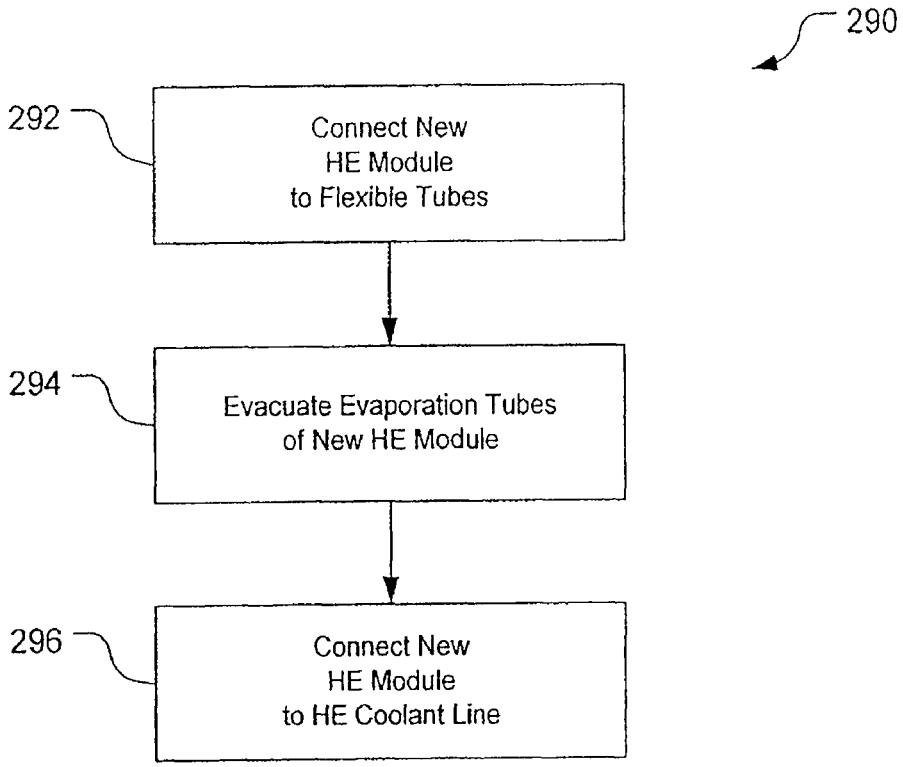
FIG. 11 is a block flow diagram of a process of adding a heat exchanger module to the heat exchanger module section shown in FIG. 4.

Referring to FIG. 4, the HE module section 18 includes a set of heat exchanger modules 150 connected to the liquid input line 110, the recovery/vacuum line 132, and the vapor line 134 via a liquid shutoff valve 152, a recovery/evacuation isolation valve 154, and a vapor isolation valve 156. While three modules 150 are shown, other quantities of the modules 150 (e.g., one, two, four, five, etc.) may be used. The modules 150 are preferably connected to the isolation valves 152, 154, 156 with flexible hoses. The functionality of the valves 152, 154, 156, and 168 may be combined into a multi-function, multi-way valve block mounted to the header assembly 110, 132, 134. The shutoff valves 152, 154, 156 can be any of a variety of valves, e.g., electric solenoid valves, with the valve 152 inhibiting flow of coolant prior to proper module commissioning (FIG. 11); The heat exchanger module section 18 is configured to transfer heat from hot IT equipment exhaust air into the HE coolant, supplied via the liquid line 110, which becomes heated and is expelled through the vapor line 134 to the C/Es 20, 22 (FIGS, 1, 3).

The heat exchanger modules 150 each include a set of fans 158 (shown representatively as a single fan), input temperature and humidity sensors 160, 162, an output air temperature sensor 164, a pressure sensor 166, a pressure regulator valve 168, finned heat exchanger tubes 170, and a dew point calculator 172 and PID controllers 174, 176 implemented by the processor 13 (FIG. 1). The dew point calculator 172 implemented by the processor 13 is configured to monitor the temperature and humidity of the input heated IT equipment exhaust air via the sensors 160, 162 to determine the dew point of incoming air. Based on the temperature and humidity of the incoming air, the calculator 172 further determines a pressure set point for incoming HE coolant and supplies this set point to the PID controller 174. The PID controller 174 uses the monitored HE coolant pressure indicated by the pressure sensor 166 as a process variable (PV) to determine a desired pressure of the HE coolant within the finned HE tube 170. The PID controller 174 regulates the pressure regulator valve 168 to provide a desired HE coolant evaporator pressure such that the pressure of the HE coolant within the heat exchanger tube 170 corresponds to a saturation temperature that is slightly above the IT air dewpoint as determined by the microprocessor 13. The HE coolant preferably does not induce condensation of the air passing over the heat exchanger tube 170 providing a sensible cooling process.

The processor 13 further monitors and regulates the output air temperature from the heat exchanger modules 150. The PID controller 176 monitors the temperature via the sensor 164 of the air exiting the module 150. Based on this information, the PID controller 176 determines an output that is provided to the PID controller 174 as a set point offset. The PID controller 174 uses the offset to control the flow regulator valve 168 to control the flow of the HE coolant through the heat exchanger tube 170 such that the output temperature of the exhausted air from the module 150 is at a desired temperature (or within a desired temperature range).

The modules 150 can be arranged in a variety of manners, e.g., to provide total desired cooling capacity, to provide redundancy between the modules 150, to provide both total desired cooling and redundancy, etc.

Figure 5:
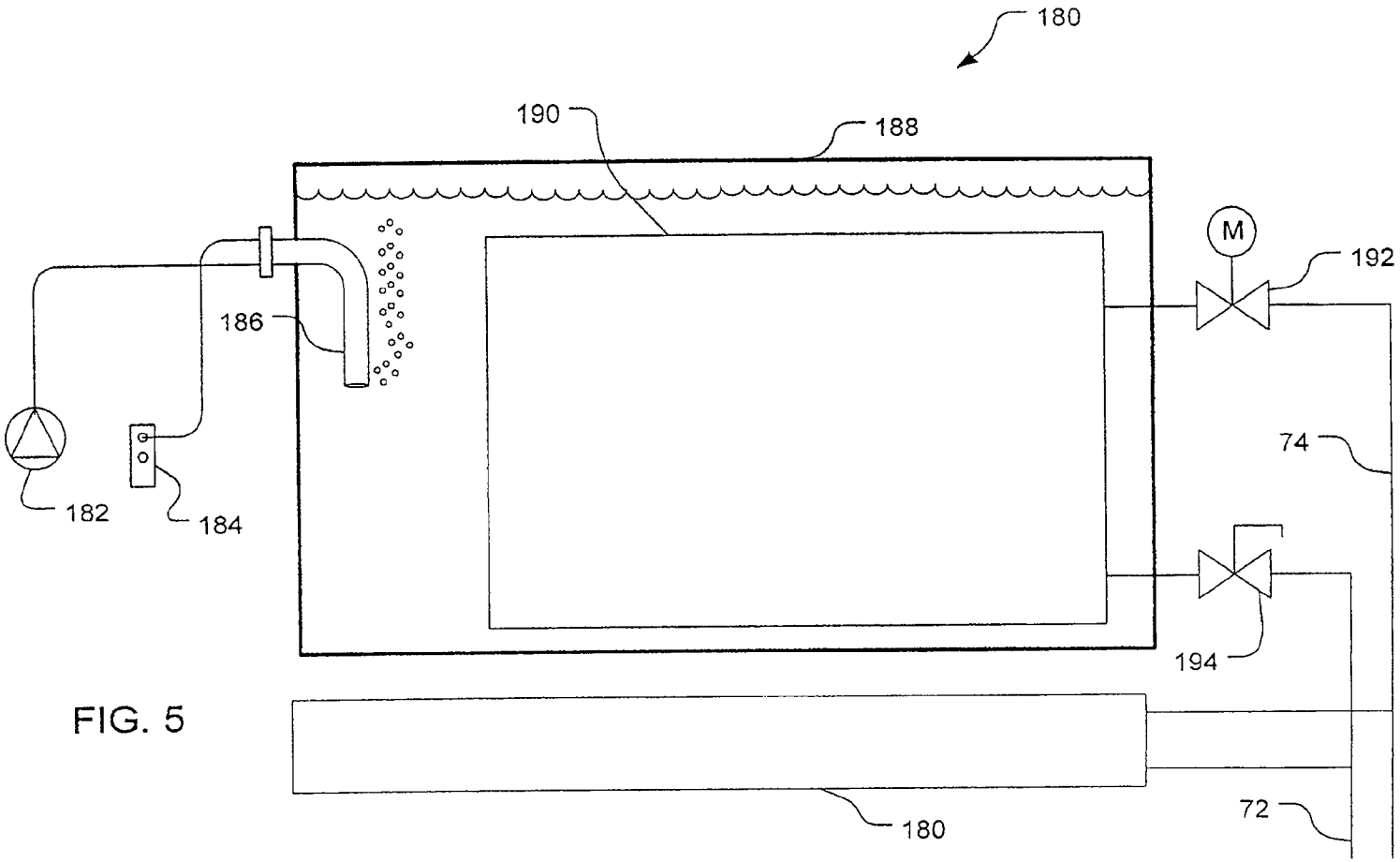
FIG. 5 is a simplified diagram of a backup coolant cooling section of the system shown in FIG. 1.

Referring to FIG. 5, the backup section 14 includes ice storage modules 180 that each include an air pump 182, a differential pressure sensor 184, a fluid level monitoring tube 186, an ice storage tank 188, a finned heat exchanger 190, and isolation valves 192, 194. Only one of the modules 180 is shown in detail in FIG. 5. Further, the number of ice storage modules 180 shown is exemplary and not limiting, with fewer or more modules 180 being possible (e.g., further cascaded as shown). The heat exchanger 190 is disposed in a reservoir of the tank 188 for holding water that may be converted to ice. The reservoirs 176 contain water while the secondary coolant comprises a glycol and water mixture. The tank 188 is connected to the line 74 (FIG. 2) through the motorized ball valve 192 to receive the secondary coolant for the heat exchanger 190. The tank 188 is further connected to the line 72 (FIG. 2) through the ball valve 194 such that the secondary coolant can flow from the heat exchanger 190 to the line 72.

Ice quantity can be monitored using the air pump 182, the pressure sensor 184, and the monitoring tube 186. The tube 186 is submersed in water in the tank 188 and pressurized using the air pump 182. The air pressure within the tube 186 displaces the water column in the tube 186 with a small quantity of air escaping in the form of bubbles from an opening in a bottom of the tube 186. The air pressure within the tube is directly proportional to the column height of water displaced which is related to the amount of ice in the tank 188 (as more ice is formed, the water expands and occupies more volume such that the liquid level rises). The pressure sensor 184 monitors the pressure used to displace the water from the tube 186. The monitored pressure is used to provide ice quantity information (e.g., in real time) and is used by the processor 13 (FIG. 1) to regulate the motorized ball valve 192 to isolate tanks 188 from the glycol solution supply line 74 (e.g., for fully ice regenerated tanks 188). Thus, some ice tanks 188 may continue to receive the secondary coolant and continue to produce ice while other modules 180 do not (e.g., helping to prevent over freezing in the tanks 188 that fully regenerate before others).

Figure 15:
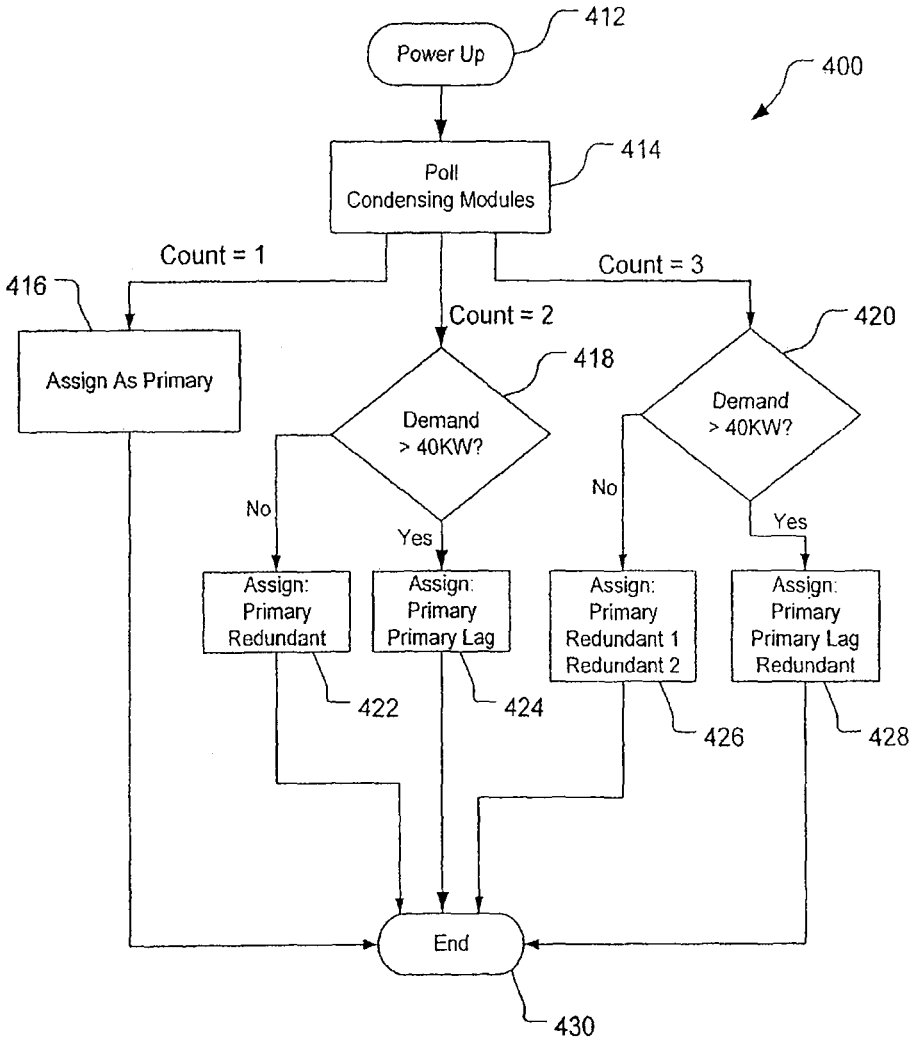
FIG. 15 is a block flow diagram of a process of assigning duties to cooling modules of the system shown in FIG. 1.

Referring to FIG. 15, with further reference to FIG. 1, a process 410 for assessing the cooling demands and capacity of the system 10 and allocating cooling modules 12 accordingly includes the stages shown. The process 410 is exemplary only and not limiting. The process 410 may be modified, e.g., by adding, removing, or rearranging the stages shown. The process 410 is preferably performed upon power up of the system 10, as indicated by stage 412. The process 410, however, may be performed at other times and in response to other events (e.g., a command from a user of the system 10).

The processor 13 uses programmed information about the module(s)12 and the system 10 to make module assignments. The processor 13 is preferably programmed with a maximum expected cooling demand and maximum cooling capacity of the module(s) 12. Alternatively, the module(s) 12 may provide information to the processor 13 as to the cooling capacity of the corresponding module 12. Multiple cooling modules 12 preferably provide equal cooling capacity, although they may provide different capacities. The process 410 will yield assignments of the cooling module(s) 12 as primary, primary lag, or redundant. The primary cooling module 12 is the module 12 that is used to cool the HE coolant unless the module 12 is inoperative. A cooling module 12 is assigned as a primary lag module if the maximum expected cooling capacity to be supplied exceeds the maximum cooling capacity of the primary module 12. The primary lag module 12 is preferably used only when the cooling demand actually exceeds the cooling capacity of the primary module 12. Multiple modules 12 could be labeled as primary lag modules 12, with each primary lag module 12 being assigned a priority number indicative of the order in which each such module 12 is activated in response to increasing cooling demand. A cooling module 12 is assigned as a redundant module if the maximum expected cooling capacity to be supplied does not exceed the maximum cooling capacity of the primary module(s) 12. Multiple modules 12 could be labeled as redundant modules 12, with each redundant module 12 being assigned a priority number indicative of the order in which each such module 12 is activated in response to increasing cooling demand, or the order in which each redundant module 12 is checked for operability. As an illustrative, but not limiting, example, the process 410 is shown with the system 10 having three cooling modules 12, each with 40 kW cooling capacity, and an expected maximum cooling demand of 80 kW.

At stage 414, the system 10 interrogates itself, with the processor 13 polling the condensing modules 12. The processor 13 polls the modules 12 to determine how many modules 12 are in the system 10. Depending on whether the processor 13 determines that there are one, two, or three of the cooling modules 12, the process 410 proceeds to stage 416, 418, or 420, respectively. The processor 13 is preferably programmed to know the maximum number of cooling modules 12 to expect, in this example three, so that if the determined count is zero or above the expected maximum, then the processor 13 re-polls the cooling modules 12.

At stage 416, the sole cooling module 12 is assigned to be the primary cooling modules 12. The sole cooling module 12 is labeled as the primary module 12 because it is the module 12 that is used to cool the HE coolant unless the module 12 is inoperative.

At stage 418, with two cooling modules 12 in the system 10, an inquiry is made as to whether the maximum cooling demand of the system 10 exceeds the cooling capacity, here 40 kW, of one of the cooling modules 12. If the demand does not exceed the individual cooling capacity, then at stage 422 the processor 13 assigns one of the modules 12 to be the primary module and the other cooling module 12 to be a redundant cooling module. If the demand does exceed the individual cooling capacity, then the processor 13 assigns one of the modules 12 to be the primary module and the other module 12 to be a primary lag module.

At stage 420, with three cooling modules 12 in the system 10, an inquiry is made as to whether the maximum cooling demand of the system 10 exceeds the cooling capacity, here 40 kW, of one of the cooling modules 12. If the demand does not exceed the individual cooling capacity, then at stage 426 the processor 13 assigns one of the modules 12 to be the primary module, a second of the modules 12 to be a redundant #1 module, and the other cooling module 12 to be a redundant #2 cooling module. If the demand does exceed the individual cooling capacity, then the processor 13 (knowing the maximum demand is 80 kW) assigns one of the modules 12 to be the primary module, a second of the modules 12 to be a primary lag module, and the other module 12 to be a redundant module.

The flow of the process 410 is exemplary and not limiting. For example, if the system 10 contained more than three cooling modules 12, then inquiries could be made for different demand thresholds, such as whether demand exceeds capacity of one module 12 and whether demand exceeds capacity of two modules 12. As another example, to make module assignments, the processor 13 could assign a first module 12 as the primary module, and then compare the maximum expected cooling demand with the cooling capacity of the primary module 12. If the demand exceeds the capacity, then the processor 13 could assign other modules 12 as primary lag modules 12 as available and as needed (with priorities for multiple lag modules 12) until the maximum cooling capacity of the primary modules 12 meets or exceeds the maximum expected cooling demand. Remaining cooling modules 12, if any, would be assigned as redundant modules 12 with priorities assigned to multiple redundant modules 12. Still other techniques for allocating the cooling modules 12 could be used.

Figure 6:
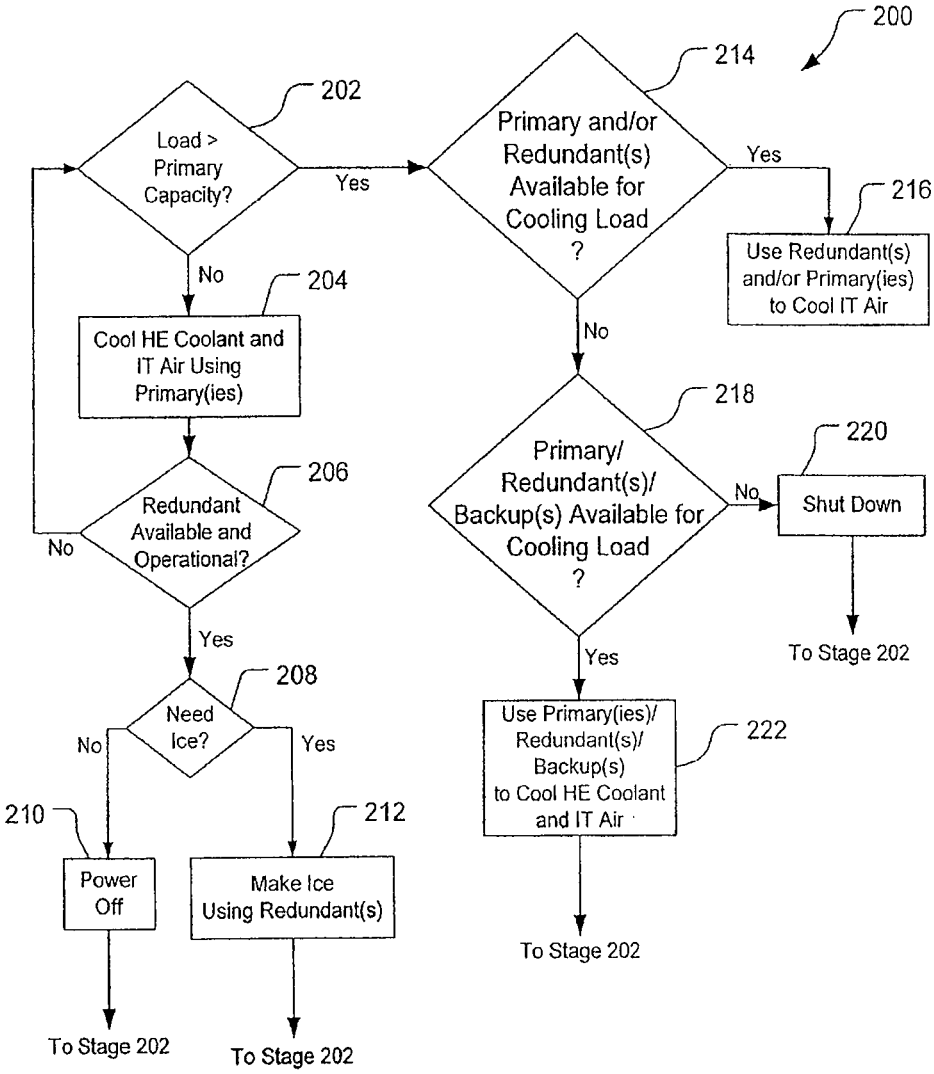
FIG. 6 is a block flow diagram of a process of selecting a cooling mechanism for cooling coolant for use in cooling IT equipment using the system shown in FIG. 1.

Referring to FIG. 6, with further reference to FIGS. 1-5, a process 200 for operating the system 10 to allot cooling modules 12, to cool heated IT exhaust air, and to make ice for backup cooling of the heated IT exhaust air includes the stages shown. The process 200 is exemplary only and not limiting. The process 200 may be modified, e.g., by adding, removing, or rearranging the stages shown.

At stage 202, an inquiry is made as to whether the present load cooling demand exceeds the cooling capacity of the primary cooling module(s) 12. For each module 12, the processor 13 determines whether the primary C/E 20 is operational, that is, receiving adequate power and is not broken. The processor 13 determines whether there has been a catastrophic failure to the primary C/E 20 that would inhibit the C/E 20 from providing adequate cooling of the HE coolant for the HE module section 18 (e.g., inadequate power supply, malfunction, etc.). The processor 13 determines which primary cooling module(s) 12 are operational and the cooling capacity provided by the operational primary cooling module(s) 12, if any. The processor 13 compares the current load demand against the capacity of the operational primary cooling module(s) 12. If the demand exceeds the capacity (e.g., if a primary cooling module 12 is failing/not operational), then the process 200 proceeds to stage 214. If the demand may be met by the operational primary cooling module(s) 12, then the process 200 proceeds to stage 204.

At stage 204, the primary cooling module(s) 12, in particular the C/E(s) 20 is(are) used to cool the HE coolant. In each primary module 12, the compressor 24 and the condenser 26 supply cool primary coolant to the C/E 20 to cool the HE coolant flowing through the C/E 20. The cooled HE coolant is then used by the HE module section 18, as described below with reference to FIG. 7, to cool the hot IT exhaust air.

At stage 206, with the primary module(s) cooling the IT air, the processor 13 inquires as to whether a redundant cooling module is available and operational. The processor 13 determines whether any redundant modules exist in the system 10 as determined/assigned in the process 410, and if so whether the redundant module(s) 12 is(are) operational. The processor 13 can determine, e.g., whether there is adequate power, whether the pumps 98 are operational and whether the secondary C/E 22 is operational.

At stage 208, the processor 13 inquires as to whether it is currently desired to prepare the backup coolant (here, ice) in the backup cooling section 14. The processor 13 may, for example, determine whether it is currently an off-peak time for utility power use, whether the current price for power use is at a desirable rate, and/or whether the current time of day and/or day of week is desirable (e.g., a weeknight or a weekend). The processor 13 further preferably determines whether any of the ice tanks 188 are below a desired level of ice. The processor 13 communicates with the level indicators 184 of the modules 180 to determine the levels of ice in the tanks 188 and determines whether any of these levels is below what is desired. If any level is below a desired level, then the processor 13 can decide to make ice. If the processor 13 determines that it is not desirable to prepare the backup coolant, then the process 200 proceeds to stage 210. At stage 210, the processor 13 ensures that power is off to the secondary C/E 22 of the redundant module(s) 12. If, however, the processor 13 determines that it is desirable to prepare the backup coolant, then the process 200 proceeds to stage 212.

At stage 212, the backup coolant is prepared, here ice being formed. The primary and secondary C/Es 20, 22 of the operational redundant module(s) 12 are operated in conjunction with the backup ice storage cooling section 14 to produce ice in the ice storage tanks 188. If the secondary C/E(s) 22 is(are) non-operational for any reason (e.g., lack of power or having a catastrophic or other failure making operation undesirable), then the backup coolant will not be prepared (e.g., ice not formed for use in cooling).

At stage 214, having determined that the primary module(s) cannot meet the cooling demand, the processor 13 makes an inquiry as to whether a sufficient combination of operational redundant and primary modules 12 exists for meeting the cooling demand. The redundant modules 12 are checked in succession of their priority numbers if multiple redundant modules 12 exist until sufficient total cooling capacity is reached for the demand. If such a combination is determined, the process 200 proceeds to stage 216 where the determined combination of primary and/or redundant modules 12 is used to cool the HE coolant and thus the hot IT exhaust air (as described with respect to FIG. 7). If a combination of primary and redundant modules 12 is not determined by the processor 13 that will meet the cooling demand, then the process 200 proceeds to stage 218.

At stage 218, the processor 13 makes an inquiry as to whether a sufficient combination of redundant, primary, and backup modules 12 exists for meeting the cooling demand. The processor 13 determines whether the cooling demand can be met by the operational primary and redundant modules 12, if any, plus any backup cooling module 12, that is, a module 12 whose primary C/E 20 is non-operational but whose secondary C/E 22 is operational. The power for the secondary C/E is preferably provided by battery backup, e.g., from an uninterruptible power supply (UPS) 23 such that a utility power failure causing the primary C/E 20 to be inoperable does not cause the secondary C/E to be inoperable. The processor 13 also determines whether there is sufficient backup coolant (here ice) for cooling the secondary coolant for cooling the HE coolant and thus the hot IT exhaust air. If the conditions do not provide for sufficient cooling to meet the demand adequately, then the process 200 proceeds to stage 220 where the system 10 is used to provide as much cooling capacity as possible to sustain IT functionality as long as possible. If the conditions do provide for sufficient cooling to meet the demand adequately, then the process 200 proceeds to stage 222.

At stage 222, the determined combination of primary, redundant, and/or backup modules 12 are used to cool the HE coolant. The backup coolant ice storage section 14 is used to cool the secondary coolant for the backup modules 12. The secondary coolant is pumped through the ice storage tanks 188 to cool the secondary coolant while melting the ice in the tanks 188. The secondary coolant is pumped through the C/E 22 of each backup module 12 for use in cooling the HE coolant that is then used to cool the hot IT exhaust air.

The process 200 loops back to stage 202 to periodically determine again whether the cooling demand can be met by the primary cooling module(s) 12. If the state of the system 10 changes from the primary cooling module(s) 12 not being able to meet the demand to being able to meet the demand, then any redundant or backup modules 12 previously used are shut down (e.g., use of UPS battery power terminated), and the primary module(s) 12 used to cool the HE coolant.

Figure 7:
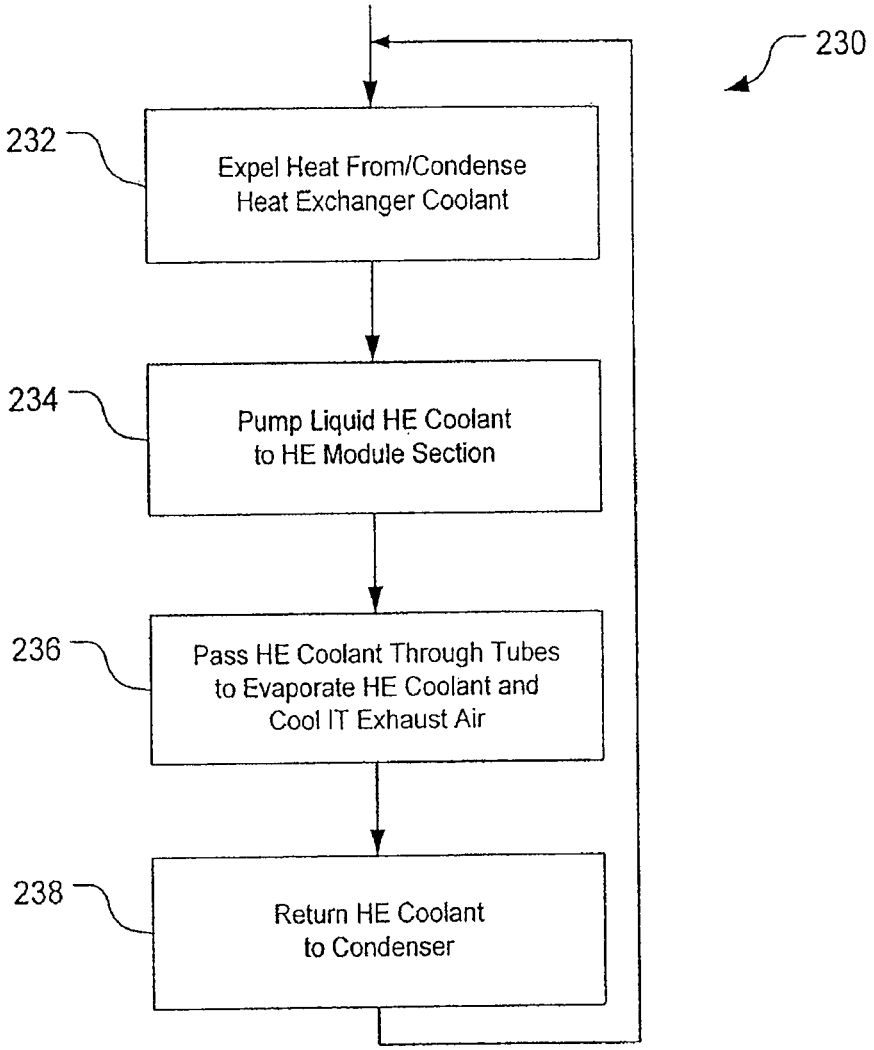
FIG. 7 is a block flow diagram of a process of cooling IT equipment using the cooling module as shown in FIG. 2, the coolant distribution section shown in FIG. 3, and the heat exchanger module section shown in FIG. 4.

Referring to FIG. 7, with further reference to FIGS. 1-4, 6, a process 230 for cooling the HE coolant and the hot IT exhaust air (see stages 204, 216, and 222 shown in FIG. 6) includes the stages shown. The process 230, however, is exemplary only and not limiting. The process 230 may be altered, e.g., by having stages added, removed, or rearranged.

At stage 232, hot, vapor HE coolant is cooled and condensed in the condensing module 12. The vapor HE coolant enters the module 12 through the line 30 with the isolation valve 31 open. As the HE coolant flows into the C/E 20 (stage 205) or the C/E 22 (stage 218), heat from the vapor is transferred through a heat exchanger in the respective C/E 20, 22 that contains relatively cool primary or secondary coolant, respectively. Enough heat is transferred to cause the HE coolant to condense to a sub-cooled liquid and to pool/collect at the bottom of the respective C/E 20, 22. The HE coolant is sub-cooled in that it is below its saturation point, thus requiring heating before it would boil/evaporate/change phase from liquid to gas.

At stage 234, the liquid HE coolant is pumped by the coolant distributor 16 to the HE module section 18. The sensor 100 provides an indication of pressure differential between the top 45 and the bottom 46 of the container 36. The pressure difference indication is used by the PI-D controller 102- to produce and send control signals to the variable frequency controller 104. The controller 104 sends signals to the pump 98 to regulate the speed of the pump 98 to maintain a desired liquid level in the container 36 and the C/Es 20, 22. The circulation pump(s) 98 of the operational cooling module(s)s 12 pumps the HE coolant through the liquid line 110 to the HE module section 18. The HE coolant may be viewed through the sight glass 112 in the line 110 to determine liquid quality and moisture content of the HE coolant. The liquid in the line 110 is cleaned and dehydrated by the filter/dryer 116. The operating pump(s) 98 increases the pressure of the HE coolant to a level that the HE coolant, after losing some pressure due to piping losses in transit to the section 18, pressure loss in the shutoff valve 156, and in the valve 168, will be at a pressure such that the HE coolant will evaporate at a temperature that is above the dew point temperature of the exhausted IT air.

The processor 13 monitors the temperature and humidity of the IT exhaust air indicated by the sensors 160, 162 and determines the corresponding dew point of the exhaust air. Using the calculated dew point for each HE module 150, the processor 13 determines desired evaporation temperatures for the HE coolant, e.g., the dew point temperatures plus a safety margin, e.g., of a few degrees Fahrenheit. The processor 13 uses these temperatures in conjunction with a known relationship between the HE coolant's saturation point (evaporation point) and the coolant's temperature and pressure to determine desired pressures of the HE coolant within the HE tubes 170.

The processor 13 further monitors and regulates the output air temperature from the heat exchanger modules 150 and determines a dew point offset. The PID controller 176 monitors the temperature via the sensor 164 of the air exiting the module 150. Based on this information, the PID controller 176 determines an output that is provided to the PID controller 174 as a set point offset.

The PID controller 174 regulates the pressure of the HE coolant within the HE tube 170 to provide a desired output temperature of the exiting IT air while inhibiting condensation of the IT air. The PID controller 174 uses the monitored HE coolant pressure indicated by the pressure sensor 166 as a process variable (PV), the set point provided by the PID controller 172 related to the dew point of the IT air, and the set point offset provided by the PID controller 176 to determine a desired pressure of the HE coolant within the filmed HE tube 170. The PID controller 174 regulates the pressure regulator valve 168 to provide a desired pressure within the HE 150 such that the pressure and temperature of the HE coolant in the heat exchanger tube 170. The pressure as sensed by pressure sensor 166 is also regulated such that the temperature of the HE coolant is slightly above the dew point of the return air such that the HE coolant preferably will not induce significant condensation of moisture contained in the air passing over the heat exchanger tube 170 providing a sensible cooling process. The controller 174 also controls the flow regulator valve 168 to control the flow of the HE coolant through the heat exchanger tube 170 such that the output temperature of the exhausted air from the module 150 is at a desired temperature (or within a desired temperature range).

At stage 236, the HE coolant passes through the HE tubes 170, absorbs heat from the IT exhaust air passing by the tubes 170 and evaporates, thereby cooling the IT exhaust air. The HE coolant enters the module 150 through the shutoff valve 152 and flexible tubing. The valve 168 is opened and closed as appropriate under the control of the PID controller 174 to maintain the pressure and temperature of the HE coolant above the dew point of the IT air outside the tubes 170. The HE coolant changes phase from saturated liquid to saturated vapor, and increases in enthalpy, as it passes through the tubes 170. The latent heat from the IT exhaust air blown across the tubes 170 by the fans 158 is removed by passing through the tubes 170 into the HE coolant, thus "cooling" the IT exhaust air (by removing the heat).

At stage 238, the HE coolant is returned to the cooling module 12. The HE coolant is drawn from the tubes 170, through flexible piping, through the isolation valve 152, and through the vapor line 134. The gas-phase HE coolant flows through the line 134 to the inlet of the cooling module 12, and into the appropriate C/E 20, 22 for cooling/condensing. The process 230 returns to stage 232.

Figure 8:
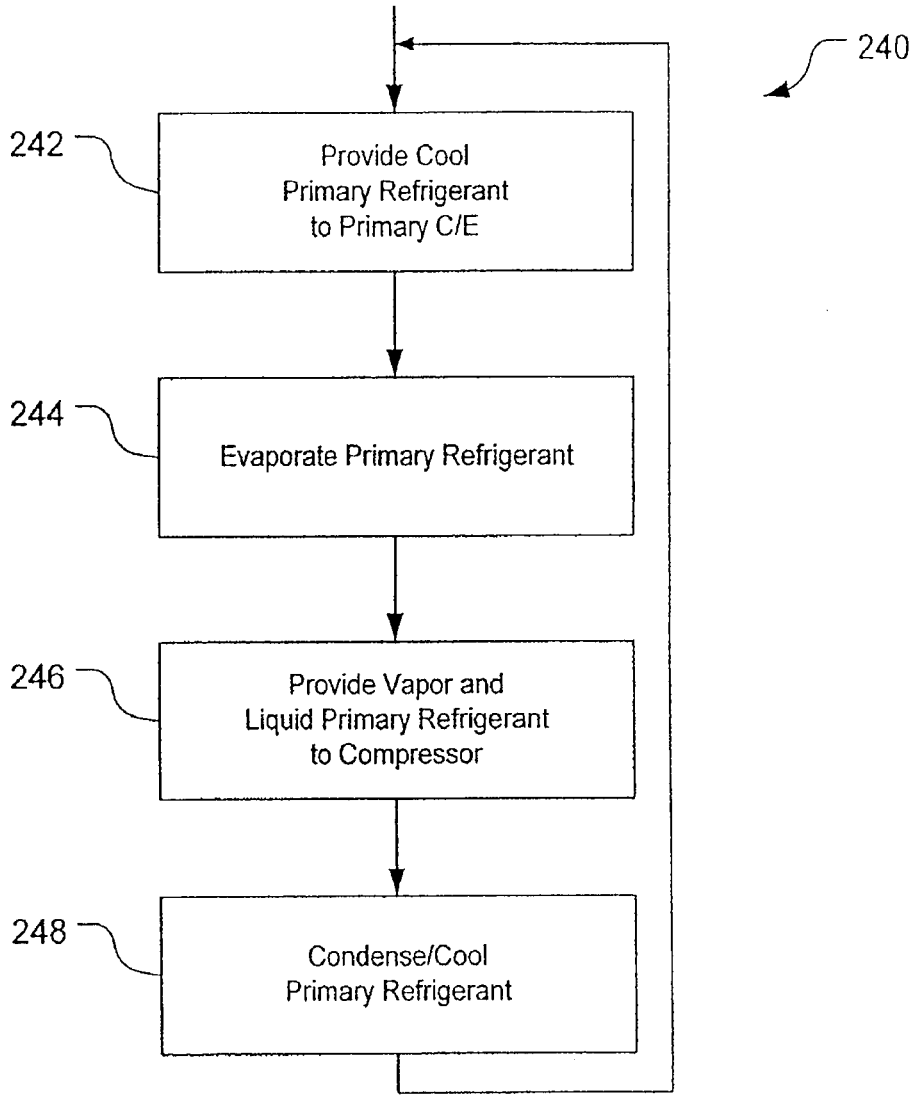
FIG. 8 is a block flow diagram of a process of cooling primary coolant using portions of the cooling module shown in FIG. 2.

Referring to FIG. 8, with further reference to FIGS. 1-2, and 6, a process 240 for implementing the stage 204 (FIG. 6) for providing sub-cooled liquid primary coolant to the C/E expansion valve 70 to cool the HE coolant, and recycling primary coolant heated and evaporated in the C/E 20 to be compressed, cooled and condensed includes the stages shown. The process 240 is exemplary and not limiting. The process 240 may be modified, e.g., by adding, removing, or rearranging stages.

At stage 242, high-pressure liquid primary coolant is supplied from the Condenser 26 to the primary C/E 20. The primary coolant passes from the condenser 26 through the sight glass 71 for viewing of quality of the primary coolant, and through the filter/dryer 73 for dehydration and cleaning. The pressure of the liquid primary coolant is dropped/reduced by the expansion valve 70 so that the primary coolant is saturated and ready to change phase to a vapor. The primary coolant is metered into the primary C/E 20 by the expansion valve 70.

At stage 244, the primary coolant changes phase into a vapor. Latent heat from the HE coolant passing through the C/E 20 transfers through plates and is absorbed by the primary coolant. This heat causes the primary coolant to convert from a saturated liquid to a super-heated gas. The primary coolant increases in enthalpy while the HE coolant correspondingly decreases in enthalpy. The PID controller 68 monitors the temperature and pressure of the primary coolant exiting the C/E 20 and actuates the expansion valve 70 such that the temperature and pressure of the primary coolant are at desired levels (superheated vapor leaving the C/E 20)

At stage 246, the primary coolant gas is provided to the compressor 24. The compressor 24 provides suction to draw the primary coolant from the C/E 20. Pressure values from the sensor 80 are used by the discharge pressure PID controller 82 to determine and send control signals to the glycol flow control valve 44. These control signals cause the valve 44 to regulate glycol flow to maintain the compressor discharge pressure at a desired level such that the primary coolant entering the condenser 26 is at the desired pressure. With this arrangement, a relatively high-temperature (e.g., about 190° F.), relatively high-pressure (e.g., about 445 psi) gas exits the compressor 24.

At stage 248, the primary coolant is cooled and condensed and supplied to the primary C/E 20. The gas exiting the compressor 24 enters the condenser 26. The condenser 26 cools the primary coolant by passing heat from the primary coolant to the coolant received from the line 38. The primary coolant leaves the condenser 38 as a relatively high-pressure (e.g., about 440 psi), relatively moderate-temperature (e.g., about 105° F.) sub-cooled liquid. This liquid is provided to the primary C/E 20. The process 240 returns to stage 242 to repeat the cycle of heating/evaporating the primary coolant, cooling/condensing the primary coolant, and recycling the primary coolant for heating, etc.

Figure 9:
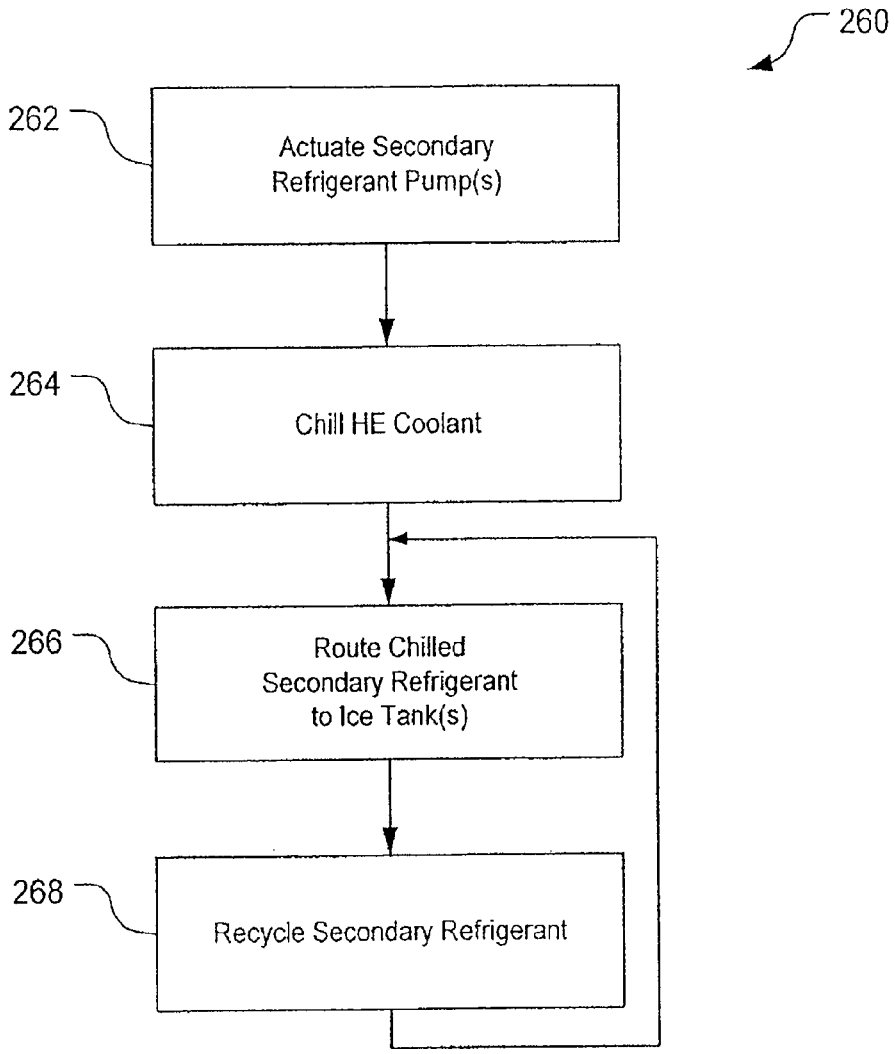
FIG. 9 is a block flow diagram of a process of making ice for backup cooling of coolant using the cooling module shown in FIG. 2 and the backup cooling section shown in FIG. 5.

Referring to FIG. 9, with further reference to FIGS. 1, 2, 5, and 6, a process 260 for implementing the stage 210 (FIG. 6) for making ice in the tanks 188 includes the stages shown. The process 260 for the ice-generation mode of the sections 12, 14 is exemplary and not limiting. The process 260 may be modified, e.g., by adding, removing, or rearranging stages.

At stage 262, the processor 13 actuates the pump(s) 77 to pump the secondary coolant to the backup coolant modules 180. If a pump 77 is not operational (at least desirably so), then the processor 13 reports a failure, deactivates the pump 77, and actuates a redundant pump. If the secondary coolant is being adequately pumped, then the process 260 proceeds.

At stage 264, the primary C/E 20 chills the HE coolant for use in cooling the secondary coolant. The primary C/E 20 chills the HE coolant that passes between the primary C/E 20 and the secondary C/E 22 with the isolation valve 31 shut to isolate the cooling module 12 from the HE module section 18. The HE coolant absorbs heat from the secondary coolant through a heat exchanger in the secondary C/E 22 (acting as an evaporator) to cool the secondary coolant (e.g., to near 0° F.).

At stage 266, the chilled secondary coolant is routed to the ice storage modules 180 to produce ice in the tanks 188. The secondary coolant flows through the line 74 to the modules 180 and into the tanks 188. Which tank(s) 188 receive secondary coolant and how much is controlled by the processor 13. The processor 13 monitors the levels of ice indicated by the level indicator 184 of each of the tanks 188 and actuates the control valves 192 associated with the tanks 188 to regulate the flow of secondary coolant through the tanks 188. As the coolant passes through the heat-transfer coils 190 in the tanks 188, heat is transferred from the water in the tanks 188 into the glycol-water secondary coolant such that the water freezes, forming ice. The formation of ice causes the level of the water in the corresponding tanks 188 to rise, increasing the pressure to overcome in the tube 186 by the air pump 182. When the level rises to a desired level, as detected by the level detector 184 of the tanks 188, then the flow of secondary coolant to that tank 188 is stopped. When the levels of all the tanks 188 reach desired levels, then the ice-making mode is preferably terminated. The ice making may be terminated at any time if the processor 13 determines that it is no longer desirable to snake ice (e.g., it is now peak time for power cost).

At stage 268, the secondary coolant is recycled. The secondary coolant leaving the tanks 188 flows back through the valve 194, the line 72, and back to the secondary C/E 22 and the tanks 188.

Figure 10:
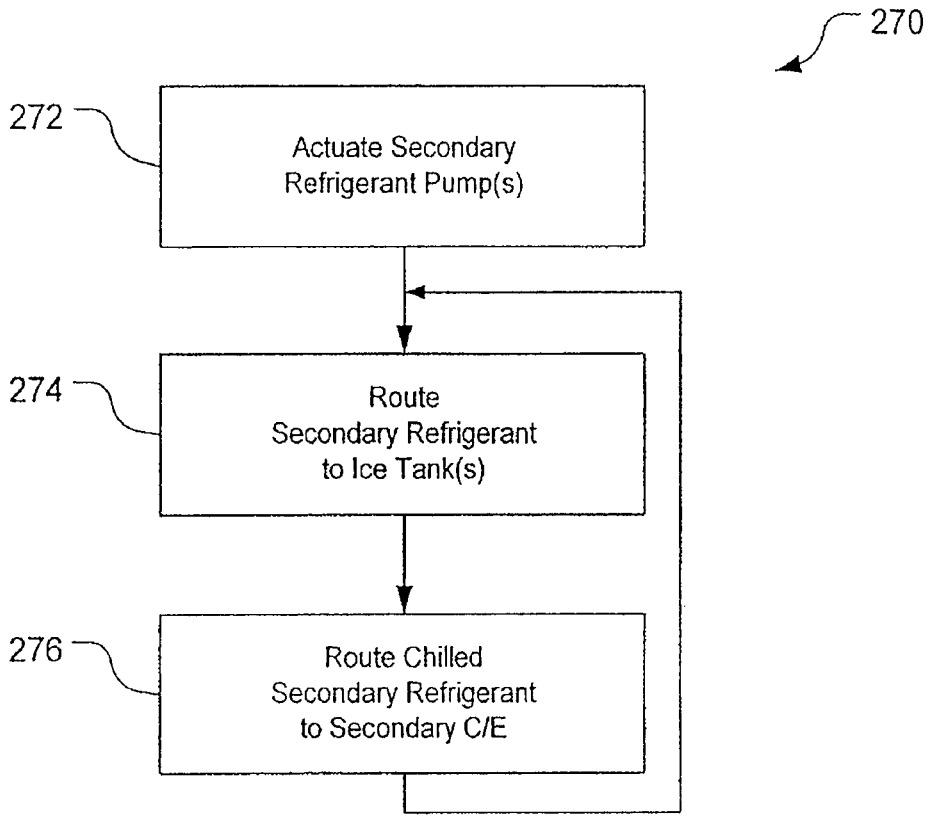
FIG. 10 is a block flow diagram of a process of cooling secondary coolant using the backup coolant cooling section shown in FIG. 5.

Referring to FIG. 10, with further reference to FIGS. 1, 2, 5 and 6, a process 270 for implementing the stage 216 (FIG. 6) for chilling the secondary coolant and the HE coolant using the ice in the tanks 188 includes the stages shown. The process 270 is exemplary and not limiting. The process 270 may be modified, e.g., by adding, removing, or rearranging stages.

At stage 272, the processor 13 actuates the pump(s) 77 (for exemplary purposes, multiple sections 12 are assumed) to pump the secondary coolant. If the pumps 77 cannot adequately pump the secondary coolant to provide sufficient flow of the secondary coolant, then the processor 13 reports a failure and selects the alternate redudant pump 77. If the secondary coolant is being adequately pumped, then the process 270 proceeds. The actuated pump(s) 77 pumps the secondary coolant to the ice tanks 188.

At stage 274, the secondary coolant is routed to the ice tanks 188 (for exemplary purposes, multiple tanks 188 are assumed). The motorized ball valves 192 are controlled by the processor 13 to route the hot secondary coolant to desired tanks 188, e.g., the tanks 188 that have sufficient ice to cool the secondary coolant. The secondary coolant (which is heated in the C/E 22 as described below) is routed through the isolation valves 192 under the control of the processor 13 to the ice tanks 188. The hot secondary coolant is passed through the tanks 188 where heat transfers from the coolant through the heat exchanger coils 190 into the ice. The transferred heat melts the ice while the coolant is cooled by the loss of heat.

At stage 276, the cooled coolant is routed through the secondary C/E 22 to cool the HE coolant. The secondary coolant leaves the tanks 188 and is pumped by the pumps 77 to the secondary C/E 22. Heat transfers through the heat exchanger of the C/E 22 from the HE coolant to the secondary coolant, heating the secondary coolant and cooling the HE coolant. The processor 13 controls the flow of the secondary coolant to maintain desired pressure and temperature of the HE coolant as cooled by the secondary coolant. The heated secondary coolant then is recycled through the ice tanks 188 for further cooling. This continues until either the primary C/E 20 becomes operational, the secondary C/E 22 becomes operational, cooling of the secondary coolant is not desired (e.g., the IT air does not need cooling), or the ice in the tanks 188 is depleted such that the secondary coolant can no longer adequately cool the HE coolant. This is indicated by the return of the process 200 to stage 202 (FIG. 6).

Figure 12:
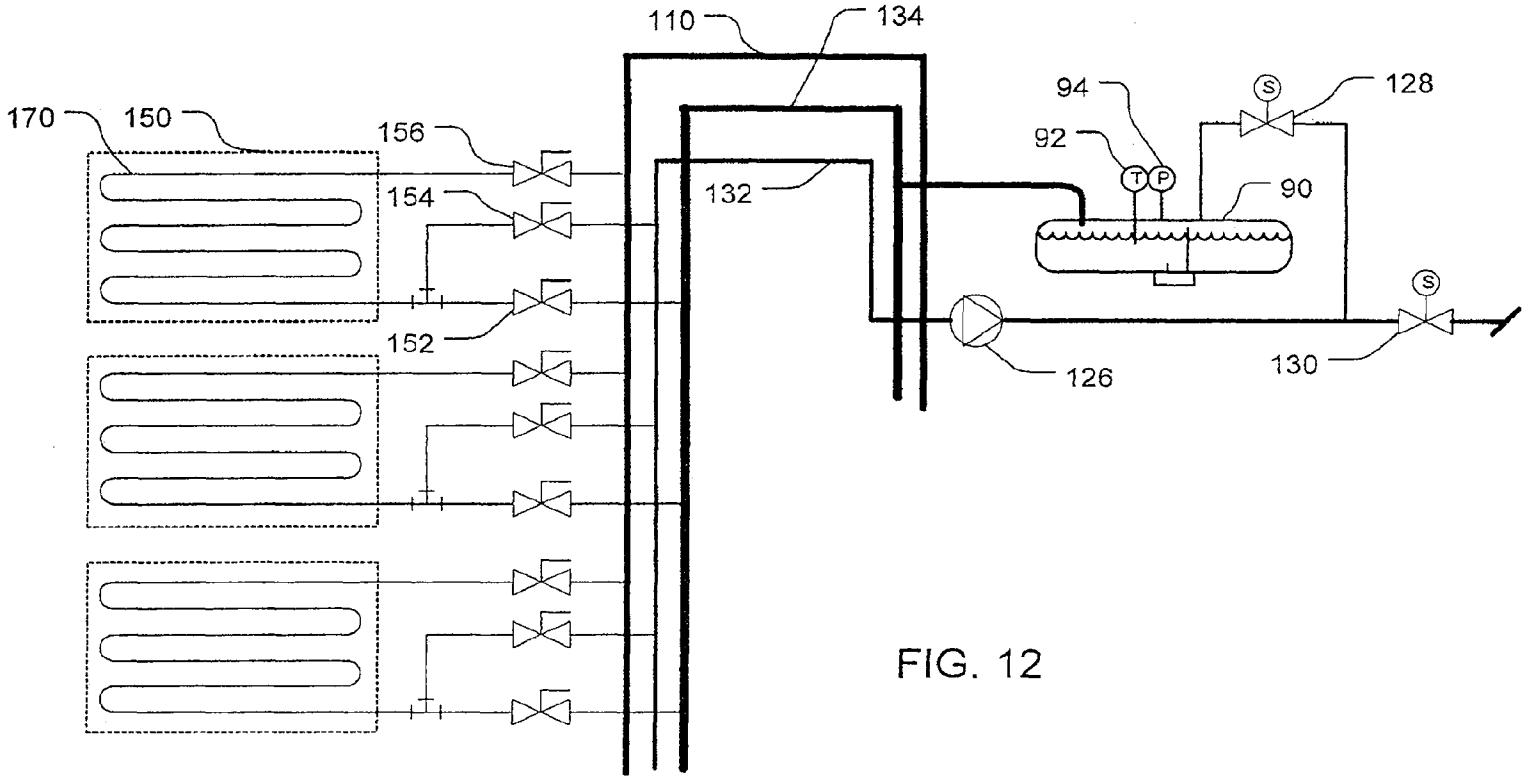
FIG. 12 is a simplified diagram of portions of the system shown in FIG. 1 for adding/removing heat exchanger modules.

Referring to FIG. 11, with further reference to FIGS. 1,3-4, and 12, with particular reference to FIG. 12, a process 290 for adding a heat exchanger module 150 to the HE module section 18 includes the stages shown. The process 290 is exemplary and not limiting. The process 290 may be modified, e.g., by adding, removing, or rearranging stages.

At stage 292, the new HE module 150 is connected to the liquid line 110, recover/vacuum line 132, and the vapor line 134 through flexible tubes. The flexible nature of the tubes helps make connection of the module 150 quick and easy. The shutoff valves 152, 154, 156 are all in, or put in, the off position, inhibiting flow of the HE coolant into the module 150.

At stage 294, gas is evacuated from the evaporation tubes 170 of the new HE module 150. The shutoff valve 154 corresponding to the new module 150 is opened, allowing gas in the evaporation tubes 170 of the new module 150 to be drawn out. The vacuum pump 126 is actuated by the processor 13 to suck gas from the tubes 170 through the reclaim/vacuum line 132. The gas vacuumed by the pump 126 is exhausted to the atmosphere, with the valve 130 open and the valve 128 closed. The vacuum pump 126 is operated until a desired pressure is reached in the tubes 170, e.g., a vacuum of 28" Hg as indicated by the pressure sensor 166. The shutoff valve 154 is closed and the pump 126 is deactivated.

At stage 296, the new module 150 is put in fluid communication with the HE coolant inlet line 110 for receiving HE coolant. The shutoff valves 152 and 156 are opened in response to control signals from the processor 13, allowing the HE coolant to flow through the new module 150.

Figure 13:
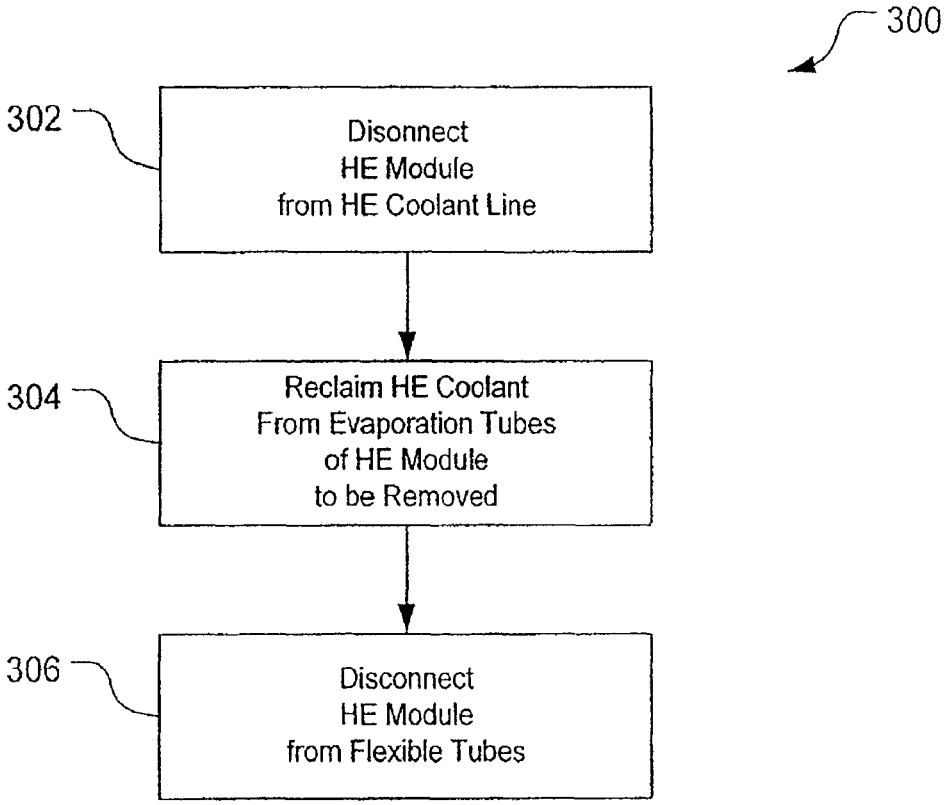
FIG. 13 is a block flow diagram of a process of removing a heat exchanger module from the heat exchanger module section shown in FIG. 4.

Referring to FIG. 13, with further reference to FIGS. 1-4, and 12, a process 300 for removing a heat exchanger module 150 from the HE module section 18 includes the stages shown. The process 300 is exemplary and not limiting. The process 300 may be modified, e.g., by adding, removing, or rearranging stages.

At stage 302, fluid communication between the module 150 and the HE coolant inlet line 110 is cut off to inhibit the module 150 from receiving HE coolant. The shutoff valves 152 and 156 are closed in response to control signals from the processor 13, inhibiting the HE coolant from flowing into the module 150 to be removed.

At stage 304, HE coolant is reclaimed from the evaporation tubes 170 of the HE module 150 to be removed. The reclaim/shutoff valve 154 corresponding to the module 150 is opened, allowing HE coolant remaining in the evaporation tubes 170 to be drawn out. The processor 13 actuates the reclaim pump 126 to pull the HE coolant from the tubes 170 through the reclaim/vacuum line 132. The HE coolant recovered by the pump 126 is supplied through the valve 128 (with the valve 130 closed) to the HE cooling receiver 90. The reclaim/recovery pump 126 is operated until a desired pressure is reached in the tubes 170, e.g., 20" Hg as indicated by the pressure sensor 166. The shutoff valve 154 is closed and the pump 126 is deactivated.

At stage 306, the HE module 150 is disconnected from the flexible tubes connecting the module 150 to the lines 110, 132, 134. The shutoff valves 152, 154, 156 are all in, or put in, the off position, inhibiting flow to/from the lines 110, 132, 134.

Figure 14:
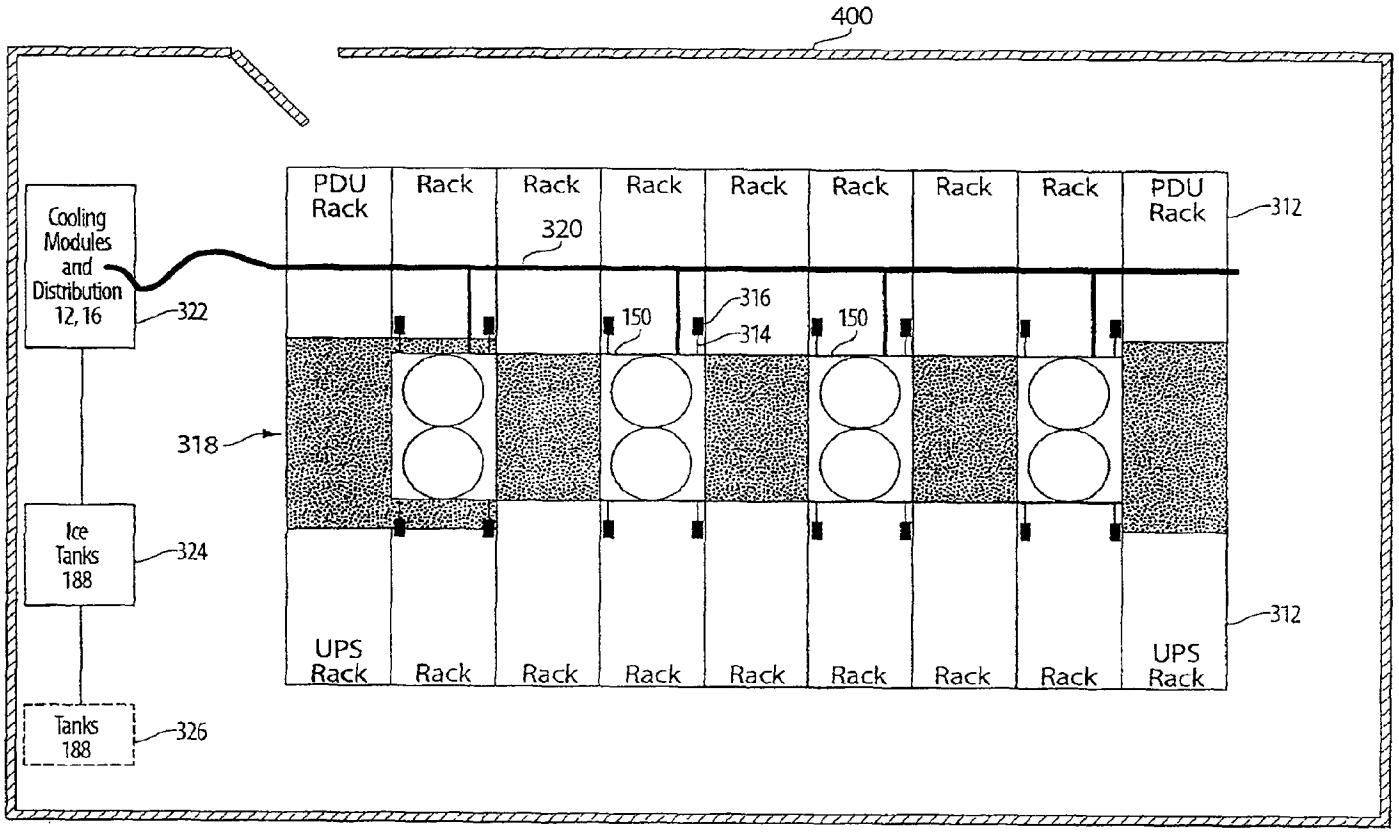
FIG. 14 is simplified top view of an exemplary mechanical layout of the system shown in FIG. 1.

Referring to FIGS. 1, 4, and 14, a preferred physical layout of the system 10 is shown in a room 400. The system is shown in use in FIG. 14 with two rows of equipment racks 312. As shown, some of the racks 312 contain power distribution units (PDUs), some contain uninterruptible power supplies (UPSs), and others contain other equipment such as telecommunications equipment. The heat exchanger modules 150 have housings that are connected to legs 314 that extend away from the modules 150 and that include feet 316 that are configured to rest on top of and be attached to the racks 312. The modules 150 are disposed above the tops of the racks 312 and directly over a hot aisle 318 between the rows of the racks 312. The hot aisle 318 is the region into which the racks 312 exhaust their heated air. The modules 150 are preferably disposed at least partially, and more preferably substantially entirely, directly over the aisle 318 (as shown, entirely over the aisle 318) with the modules 150, legs 314, and feet 316 straddling the aisle 318. The modules 150 are connected to the primary cooling modules 12 and coolant distribution section 16 through a line 320 that includes the input line 110, the output line 134, the reclaim/vacuum line 132 (FIG. 3), and appropriate electrical lines. The modules 12 and the section 16 are preferably contained in a housing 322 and are preferably disposed remotely from the racks 312, although any of these components could be disposed in one or more rows of the racks 312. The ice tanks 188 are contained in a housing 324 disposed remotely from both the racks 312 and the housing 322. As indicated, some ice tanks 188 can be disposed in a separate housing 326 that is displaced from the housing 324. The tanks 188 may also be disposed in one or more rows of the racks 312. Physical layouts of the system 10 other than that shown in FIG. 14 are possible.

Other embodiments are within the scope and spirit of the appended claims. For example, due to the nature of software, functions described above can be implemented using software, hardware, firmware, hardwiring, or combinations of any of these. Features implementing functions may also be physically located at various positions, including being distributed such that portions of functions are implemented at different physical locations. Further, while only one vacuum/reclaim line 134 is shown and described above, multiple lines may be used. For example, separate lines may be used for vacuuming gas and reclaiming HE coolant. In this case, each line would preferably have a shutoff valve to inhibit undesired flow of gas or coolant.

Still other embodiments are within the scope of the invention. For example, the cooling module 12 may be implemented without the primary C/E 20, the compressor 24, or the condenser 26. In this case, the secondary C/E 22 would preferably be connected to a building chilled water supply via the lines 72, 74. In this configuration, the cooling modules 12 could be cascaded as with the modules 12 including the primary C/E 20, the compressor 24, and the condenser 26. Ice backup could be used with this arrangement, e.g., if switches/valves were placed in the lines 72, 74 that could selectively fluidly couple the building chilled water or the ice storage to the C/E 22. Further embodiments could use the cooling modules 12 without the secondary C/E 22. Also, the heat exchanger module section 18 may include more than one heat exchanger, e.g., five or more heat exchangers, and the heat exchanger(s) may have any of a variety of form factors.

Further, while the description above refers to the invention, the description may include more than one invention.

What is claimed is:

1. A system for cooling gas heated by heat-producing electronic equipment, the system comprising:

a heat exchanger configured to transfer heat from the heated gas to a first coolant;

a first cooling module connected for fluid communication with the heat exchanger and including a first condenser configured to cool and condense incoming first coolant from vapor to liquid, the first cooling module being configured to transfer heat from the first coolant to a second coolant to cool the first coolant;

a second cooling module connected for fluid communication with the heat exchanger and including a second condenser configured to cool and condense incoming first coolant from vapor to liquid, the second cooling module being configured to transfer heat from the first coolant to a third coolant to cool the first coolant; and a condenser-charge controller configured to regulate a first coolant liquid level in the first condenser.

2. The system of claim 1 wherein the condenser-charge controller comprises first and second condenser-charge controller subsystems connected and configured to control liquid levels in the first and second condensers, respectively.

3. The system of claim 2 wherein the first and second subsystems each include a liquid level sensor configured to determine a liquid level in the respective condenser, a pump, and a controller coupled to the pump and the liquid level sensor and configured to regulate the pump to affect the corresponding liquid level.

4. The system of claim 3 wherein the liquid level sensor is a pressure differential sensor and wherein the cooling module includes a coolant container connected to the condenser and the pump and the liquid level sensor is connected to the coolant container to determine the liquid level in the coolant container, the liquid level in the coolant container being related to the liquid level of the condenser.

5. The system of claim 3 wherein the first and second cooling modules further comprise:

a container connected to the condenser and configured to store the first coolant;

a pump connected to the container and configured to pump the first coolant from the container;

a purge mechanism connected to the pump;

a purge controller coupled to the purge mechanism and configured to actuate the purge mechanism to purge at least some of the first coolant pumped by the pump;

a fill mechanism connected to the container; and a fill controller coupled to the fill mechanism and configured to actuate the fill mechanism to supply liquid first coolant to the container.

6. The system of claim 5 wherein the purge controller is configured to actuate the purge mechanism if the pump is operating at about full capacity and the liquid level of the container rises above an upper threshold level and/or more than a first threshold amount.

7. The system of claim 5 wherein the fill controller is configured to actuate the fill mechanism if the pump is operating at about minimum capacity and the liquid level of the container drops below a lower threshold level and/or more than a second threshold amount.

8. A system for cooling gas heated by passing the gas over heat-producing equipment to cool the equipment, the system comprising:

a heat exchanger including a heat exchanger heat transfer mechanism configured to transfer heat from the heated gas to a heat exchanger coolant;

a first condensing module connected for fluid communication with the heat exchanger and including a first heat transfer mechanism, the first condensing module being configured to transfer heat through the first heat transfer mechanism from the heat exchanger coolant to a first coolant in the first heat transfer mechanism;

a second condensing module connected for fluid communication with the heat exchanger and including a second heat transfer mechanism, the second condensing module being configured to transfer heat through the second heat transfer mechanism from the heat exchanger coolant to a second coolant in the second heat transfer mechanism; and a processor coupled to the first and second condensing modules and configured to assign a cooling task to each of the condensing modules based upon expected cooling demand for the heat exchanger coolant and cooling capacities providable by at least *one of* the first [and] *or* second condensing modules;

wherein the processor is configured to assign the first condensing module as a primary module for cooling the heat exchanger coolant, to assign the second condensing module as a lag module, for cooling the heat exchanger coolant, if the expected cooling demand exceeds a cooling capacity providable by the first condensing module, and to assign the second condensing module as a redundant module if the cooling capacity of the first condensing module plus the cooling capacity of any lag condensing modules is at least as great as the expected cooling demand, the redundant module being designated for use in cooling a backup refrigerant if the primary module and any lag modules are operational and for cooling the heat exchanger coolant if the primary module or any lag modules are not operational.

9. The system of claim 8 wherein the first and second condensing modules are coupled in parallel through a single coolant loop to the heat exchanger.

10. The system of claim 8 wherein the primary condensing module is used to cool the heat exchanger coolant unless the primary condensing module is inoperative, the lag module, if any, is used to cool the heat exchanger coolant if the cooling demand exceeds the cooling capacity of the primary module and any other lag module, and the redundant module, if any, is used to cool the heat exchanger coolant if any of the primary and lag, if any, modules is inoperative and the cooling demand exceeds the cooling capacity of the operative primary and lag, if any, modules, and is used to produce ice if the cooling capacity of the operative primary and lag, if any, modules at least meets the cooling demand.

11. The system of claim 8 wherein the first and second condensing modules each have a cooling capacity that is no greater than an expected cooling demand for the heat exchanger coolant.

12. The system of claim 8 wherein the first and second condensing modules each have a cooling capacity that is at least as great as an expected cooling demand for the heat exchanger coolant.

13. The system of claim 8 wherein the second heat transfer mechanism is further configured to transfer heat through the second heat transfer mechanism from the heat exchanger coolant to a third coolant in the second heat transfer mechanism.

14. A system for cooling gas heated by passing the gas over heat-producing equipment to cool the equipment, the system comprising:

a heat exchanger including a heat exchanger heat transfer mechanism configured to transfer heat from the heated gas to a heat exchanger coolant;

a first condensing module connected for fluid communication with the heat exchanger and including a first heat transfer mechanism, the first condensing module being configured to transfer heat through the first heat transfer mechanism from the heat exchanger coolant to a first coolant in the first heat transfer mechanism; and a second condensing module connected for fluid communication with the heat exchanger and including a second heat transfer mechanism, the second condensing module being configured to transfer heat through the second heat transfer mechanism from the heat exchanger coolant to a second coolant in the second heat transfer mechanism;

wherein the system is configured to use excess cooling capacity of the second condensing module to produce ice for use in cooling the heat exchanger coolant if the first condensing module is inoperative.

15. The system of claim 14 wherein the second heat transfer mechanism is further configured to transfer heat through the second heat transfer mechanism from the heat exchanger coolant to a third coolant in the second heat transfer mechanism.

16. A system for cooling gas heated by passing the gas over heat-producing equipment to cool the equipment, the system comprising:

a heat exchanger including a heat exchanger heat transfer mechanism configured to transfer heat from the heated gas to a heat exchanger coolant;

a first condensing module connected for fluid communication with the heat exchanger and including a first heat transfer mechanism, the first condensing module being configured to transfer heat through the first heat transfer mechanism from the heat exchanger coolant to a first coolant in the first heat transfer mechanism;

a second condensing module connected for fluid communication with the heat exchanger and including a second heat transfer mechanism, the second condensing module being configured to transfer heat through the second heat transfer mechanism from the heat exchanger coolant to a second coolant in the second heat transfer mechanism, wherein the second heat transfer mechanism is further configured to transfer heat through the second heat transfer mechanism from the heat exchanger coolant to a third coolant in the second heat transfer mechanism[, wherein the second heat transfer mechanism is further configured to transfer heat through the second heat transfer mechanism from the heat exchanger coolant to a third coolant in the second heat transfer mechanism]; and an ice storage tank connected to the second heat transfer mechanism, wherein the second condensing module includes a battery and a pump that is connected to the battery and the ice storage tank, and wherein the battery is configured to power the pump and the pump is connected and configured to circulate the third coolant between the second heat transfer mechanism and the ice storage tank to cool the third coolant with the ice and to cool the heat exchanger coolant with the third coolant.

17. The system of claim 16 further comprising a processor coupled to the first and second condensing modules and configured to assign a cooling task to each of the condensing modules based upon expected cooling demand for the heat exchanger coolant and cooling capacities providable by at least the first and second condensing modules.

18. The system of claim 16 wherein the second heat transfer mechanism is further configured to transfer heat through the second heat transfer mechanism from the heat exchanger coolant to a third coolant in the second heat transfer mechanism.

19. The system of claim [13] *14 further comprising* a processor coupled to the first and second condensing modules and configured to assign a cooling task to each of the condensing modules based upon expected cooling demand for the heat exchanger coolant and cooling capacities providable by at least the first and second condensing modules.

*20. The system of claim 1 further comprising:*

*a coolant distribution subsystem connected to the heat exchanger and the first and second cooling modules and configured to transfer the cooled first coolant from the first and second cooling modules to the heat exchanger and to transfer the heated first coolant from the heat exchanger to the first and second cooling modules; and*

*at least one processor coupled to the coolant distribution subsystem and the heat exchanger, and configured to:*

*determine a dew point of the gas associated with the heat exchanger;*

*monitor a physical characteristic of the first coolant relevant to saturation of the first coolant; and*

*control supply of the first coolant to the heat exchanger such that a combination of temperature and pressure of the first coolant entering the heat exchanger put the first coolant at a saturation point of the first coolant with a first coolant temperature being above the determined dew point temperature.*

*21. The system of claim 20 wherein the coolant distribution subsystem further comprises a first coolant temperature sensor and a first coolant pressure sensor configured to monitor temperature and pressure of the first coolant exiting the first and second cooling modules, the at least one processor being coupled to the first coolant temperature sensor and the first coolant pressure sensor and configured to regulate the first and second cooling modules such that the temperature and pressure of the first coolant exiting the first and second cooling modules are at desired levels.*

*22. The system of claim 20 wherein the heat exchanger is part of a heat exchanger section that includes multiple heat exchangers and wherein the at least one processor is configured to:*

*determine respective dew points of the gas in respective vicinities of each of the multiple heat exchangers;*

*monitor the physical characteristic of the first coolant near an entrance to each of the multiple heat exchangers; and*

*control supply of the first coolant to the multiple heat exchangers such that combinations of temperature and pressure of the first coolant entering respective ones of the multiple heat exchangers put the first coolant at saturation points of the first coolant with respective first coolant temperatures being above respective determined dew point temperatures.*

*23. The system of claim 20 further comprising a heat exchanger temperature (HET) sensor and a heat exchanger humidity (HEH) sensor configured to monitor a temperature and a humidity of the heated gas disposed adjacent to the heat exchanger, the at least one processor being coupled to the HET sensor and to the HEH sensor and being configured to use temperature and humidity indicia from the HET and HEH sensors to determine the at least one dew point.*

*24. The system of claim 1 further comprising:*

*a first shutoff valve connected to an output of the first cooling module for receiving the first coolant and connected to an input of the heat exchanger to selectively permit flow of the first coolant from the first cooling module to the heat exchanger;*

*a second shutoff valve connected to an output of the heat exchanger and connected to an input of the first cooling module to selectively permit flow of the first coolant from the heat exchanger toward the first cooling module;*

*a third shutoff valve coupled to the heat exchanger; and*

*a pump arrangement connected to the third shutoff valve and configured to draw gas and the first coolant through the third shutoff valve from the heat exchanger.*

*25. The system of claim 24 wherein the pump arrangement is configured to vent the drawn gas to a region external to the system.*

*26. The system of claim 24 wherein the pump arrangement is further connected to the first cooling module and is configured to convey the drawn first coolant to the first cooling module.*

*27. The system of claim 24 further comprising a plurality of sets of first, second, and third shutoff valves connected to the output of the first cooling module, the input of the first cooling module, and the pump arrangement, respectively, the system further comprising a processor coupled to the first, second, and third shutoff valves of each of the plurality of sets and to the pump arrangement, the processor being configured to control the shutoff valves and the pump arrangement such that:*

*in response to an indication to add a new heat exchanger to the system with the new heat exchanger being coupled to a new set of the first, second, and third shutoff valves, the processor will cause the first and second shutoff valves of the new set to be closed, the third shutoff valve of the new set to be opened, the pump arrangement to draw gas from the new heat exchanger until a desired pressure is attained in the new heat exchanger and then the processor will cause the third shutoff valve of the new set to be closed, and the first and second shutoff valves of the new set to be opened; and*

*in response to an indication to remove a certain heat exchanger from the system with the certain heat exchanger being coupled to a certain set of the first, second, and third shutoff valves, the processor will cause the first and second shutoff valves of the certain set to be closed, the third shutoff valve of the certain set to be opened, the pump arrangement to draw the first coolant from the certain heat exchanger until a desired pressure is attained in the certain heat exchanger and then the processor will cause the third shutoff valve of the certain set to be closed, and the first and second shutoff valves of the certain set to be opened.*

*28. The system of claim 16 further comprising:*

*an outgoing pump coupled to the second condensing module and the heat exchanger and configured to pump the heat exchanger coolant from the second condensing module to the heat exchanger; and*

*wherein the second heat transfer mechanism comprises cooling means for transferring the heat from the heat exchanger coolant through at least one of a plurality of heat transfer elements into at least one of the second coolant or the third coolant.*

*29. The system of claim 28 wherein the cooling means is configured to select between which one of the second coolant and the third coolant to use to cool the first coolant.*

*30. The system of claim 28 wherein the cooling means includes primary cooling means for cooling the second coolant.*

*31. The system of claim 30 wherein the primary cooling means is configured to cool the third coolant, and the cooling means is configured to direct the third coolant cooled by the primary means to the ice storage tank to freeze water stored in the ice storage tank.*

*32. The system of claim 30 wherein the cooling means is configured to regulate amounts of the second coolant provided to the second condensing module to control at least a temperature of the first coolant pumped from the second condensing module.*

*33. The system of claim 30 further comprising pump regulator means for regulating the outgoing pump to control pressure of the first coolant such that the first coolant entering the heat exchanger will be at saturation while a temperature of the first coolant entering the heat exchanger is above a dew point temperature of the heated gas in a vicinity of the heat exchanger.*

*34. The system of claim 8 further comprising:*

*a plurality of equipment racks configured to house the heat-producing equipment, the racks being arranged in rows such that equipment disposed in the racks will vent hot air into an aisle defined between the rows of racks; and*

*a heat exchanger unit including the heat exchanger, the heat exchanger unit including:*

*a housing configured to contain the heat exchanger; and*

*a mounting apparatus connected to the housing and to at least one rack, the mounting apparatus configured such that the heat exchanger is disposed at least partially vertically aligned with the aisle.*

*35. The system of claim 34 wherein the mounting apparatus is configured such that the heat exchanger is disposed at least partially directly over the aisle.*

*36. The system of claim 35 wherein the mounting apparatus is configured such that the heat exchanger is disposed substantially entirely directly over the aisle.*

*37. The system of claim 36 wherein the mounting apparatus is configured to connect to at least one rack in each of two different rows of the equipment racks such that the heat exchanger unit straddles the aisle.*

* * * * *